US012702068B2

(12) United States Patent
Ahmed et al.

(10) Patent No.: US 12,702,068 B2
(45) Date of Patent: Aug. 4, 2026

(54) MICRO LIGHT EMITTING DIODE STRUCTURES FOR EFFICIENT COMMUNICATION OF AN OPTICAL SIGNAL

(71) Applicant: Intel Corporation, Santa Clara, CA (US)

(72) Inventors: Khaled Ahmed, San Jose, CA (US); Brandon Marin, Gilbert, AZ (US)

(73) Assignee: Intel Corporation, Santa Clara, CA (US)

( * ) Notice: Subject to any disclaimer, the term of this patent is extended or adjusted under 35 U.S.C. 154(b) by 332 days.

(21) Appl. No.: 18/225,044

(22) Filed: Jul. 21, 2023

(65) Prior Publication Data

US 2024/0038735 A1      Feb. 1, 2024

Related U.S. Application Data

(60) Provisional application No. 63/393,771, filed on Jul. 29, 2022.

(51) Int. Cl.
H10W 90/00          (2026.01)
H10H 20/813         (2025.01)
(Continued)

(52) U.S. Cl.
CPC .......... H10W 90/00 (2026.01); H10H 20/821 (2025.01); H10H 20/8512 (2025.01)

(58) Field of Classification Search
CPC ............. H10H 20/821; H10H 20/8512; H10H 20/8515; H10H 20/818; H10H 20/813; H01L 25/0753; H10W 90/00
See application file for complete search history.

(56) References Cited

U.S. PATENT DOCUMENTS 8,350,249 B1 *   1/2013   Svensson .............. H10H 20/818
                                                                 257/14
2002/0096994 A1 *   7/2002   Iwafuchi .............. H10H 20/018
                                                                 257/E27.111
(Continued)

OTHER PUBLICATIONS

Chen, Horng-Shyang, et al., "Surface plasmon coupled light-emitting diode with metal protrusions into p-GaN", Appl. Phys. Lett. 102, 041108 (2013), 5 pgs.
(Continued)

*Primary Examiner* — Monica D Harrison
*Assistant Examiner* — Jacob T Nelson
(74) *Attorney, Agent, or Firm* — Essential Patents Group, LLP

(57) ABSTRACT

Techniques and mechanisms for a micro-LED ("uLED") structure to facilitate efficient communication of an optical signal. In an embodiment, a columnar "nanopost" uLED structure comprises contiguous bodies of respective semiconductor materials, including a first body of a doped semiconductor material. The first body forms a pyramidal structure, wherein one or more others of the contiguous bodies are arranged on the first body in a vertically stacked configuration. In another embodiment, a second body of an undoped semiconductor material is to provide a quantum well of the uLED structure, wherein the second body does not cover or otherwise extend along vertical sidewall structures of the first body.

14 Claims, 11 Drawing Sheets

(51) Int. Cl.
     *H10H 20/821* (2025.01)
     *H10H 20/851* (2025.01)

(56) References Cited

U.S. PATENT DOCUMENTS

| 2011/0315988 | A1* | 12/2011 | Yu | H10F 77/1437 |
| | | | | 257/458 |
| 2013/0075693 | A1* | 3/2013 | Svensson | H10F 77/1437 |
| | | | | 257/E33.034 |
| 2019/0295992 | A1* | 9/2019 | Ahmed | H01L 25/167 |
| 2020/0135970 | A1* | 4/2020 | Dasgupta | H10H 20/01335 |
| 2021/0327857 | A1* | 10/2021 | Li | H10H 20/8512 |
| 2023/0065016 | A1* | 3/2023 | Choi | H10H 29/14 |
| 2024/0038820 | A1* | 2/2024 | Park | H10H 20/821 |

OTHER PUBLICATIONS

Cho, Chu-Young, et al., "Surface plasmon-enhanced light-emitting diodes using silver nanoparticles embedded in p-GaN", IOP Publishing, Nanotechnology 21 (2010) 205201, 5 pgs.

Fadil, Ahmed, et al., "Investigations of thin p-GaN light-emitting diodes with surface plasmon compatible metallization", 2016 Conf. Lasers Electro-Optics, CLEO 2016, No. c, pp. 3-4, 2016.

Holler, Mirko, et al., "High-resolution non-destructive three-dimensional imaging of integrated circuits", Nature, vol. 543, Mar. 16, 2017, 16 pgs.

Lin, Chun-Han, et al., "High Modulation Bandwidth of a Light-Emitting Diode with Surface Plasmon Coupling", IEEE Transactions on Electron Devices, vol. 63, No. 10, Oct. 2016, 7 pgs.

Maier, Stefan A, et al., "Observation of coupled plasmon-polariton modes of plasmon waveguides for electromagnetic energy transport below the diffraction limit", Prop. Met. Nanostructures, vol. 4810, 2002, 12 pgs.

Nami, Mohsen, et al., "Optical properties of plasmonic light-emitting diodes based on flip-chip III-nitride core-shell nanowires", Opt. Express, vol. 22, No. 24, p. 29445, 2014, 11 pgs.

Near, Rachel, et al., "Extinction vs Absorption: Which is the Indicator of Plasmonic Field Strength for Silver Nanocubes?", J. Phys. Chem. C, vol. 116, No. 43, p. 23019-23026, 2012.

Rozin, Matthew J., et al., Colloidal metasurfaces displaying near-ideal and tunable light absorbance in the infrared, Nat. Commun., vol. 6, pp. 1-7, 2015.

Su, Chia-Ying, et al., "Dependencies of surface plasmon coupling effects on the p-GaN thickness of a thin-p-type light-emitting diode", Optics Express, vol. 25, No. 18, Sep. 4, 2017, 11 pgs.

Wang, Xiangxian, et al., "Surface-enhanced Raman scattering by composite structure of gold nanocube-PMMA-gold film", Optical Materials Express, vol. 9, No. 4, Apr. 2019, 10 pgs.

Zhu, Shichao, et al., "Enhancing the spontaneous emission rate by modulating carrier distribution in GaN-based surface plasmon light-emitting diodes", Opt. Express, vol. 25, No. 9, p. 9617, 2017, 11 pgs.

Zhu, Shi-Chao, et al., "Enhancement of the modulation bandwidth for GaN-based light-emitting diode by surface plasmons", Opt. Express, vol. 23, No. 11, p. 13752, 2015, 9 pgs.

* cited by examiner

100

200

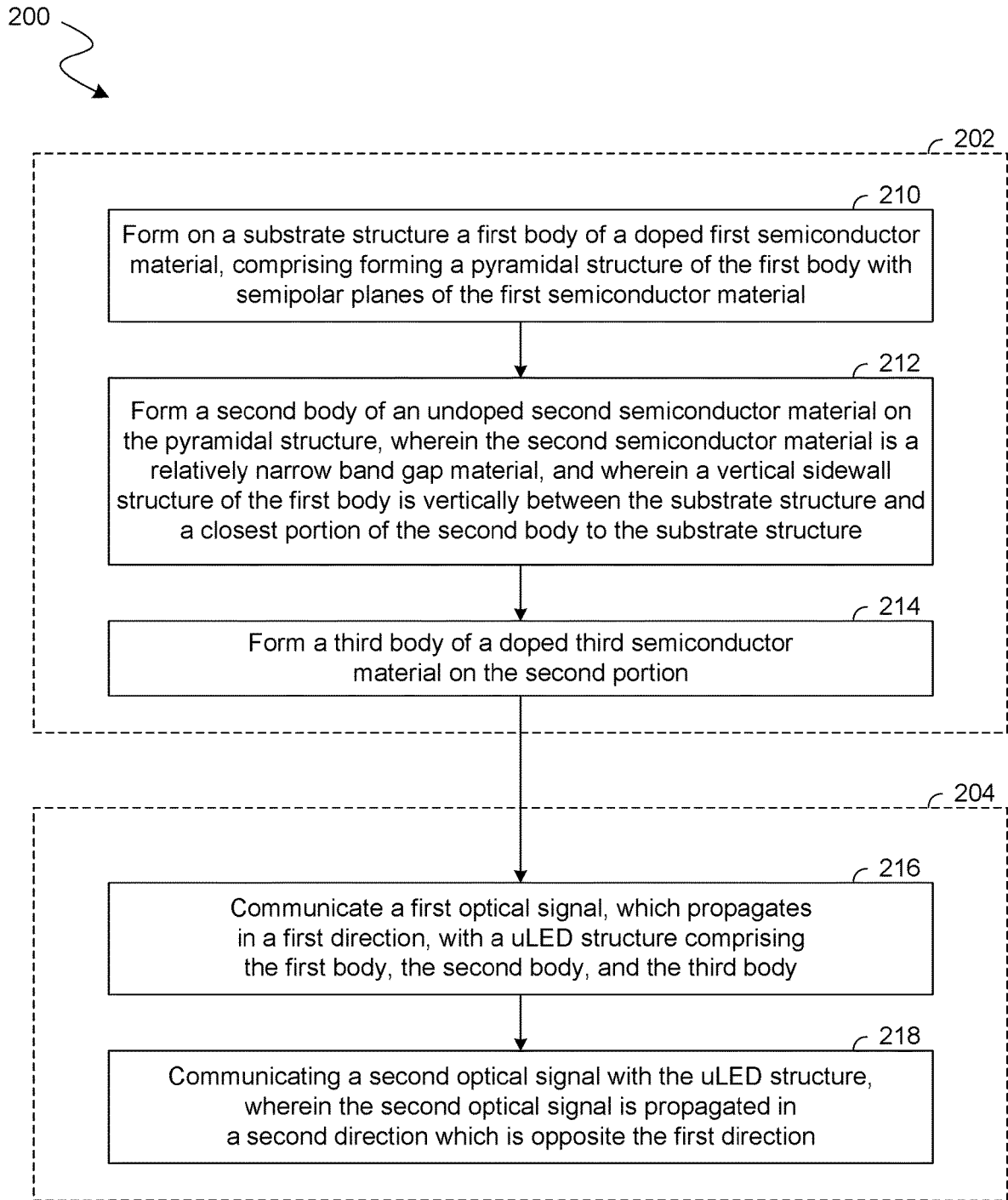

202

210

Form on a substrate structure a first body of a doped first semiconductor material, comprising forming a pyramidal structure of the first body with semipolar planes of the first semiconductor material

212

Form a second body of an undoped second semiconductor material on the pyramidal structure, wherein the second semiconductor material is a relatively narrow band gap material, and wherein a vertical sidewall structure of the first body is vertically between the substrate structure and a closest portion of the second body to the substrate structure

214

Form a third body of a doped third semiconductor material on the second portion

204

216

Communicate a first optical signal, which propagates in a first direction, with a uLED structure comprising the first body, the second body, and the third body

218

Communicating a second optical signal with the uLED structure, wherein the second optical signal is propagated in a second direction which is opposite the first direction

FIG. 2

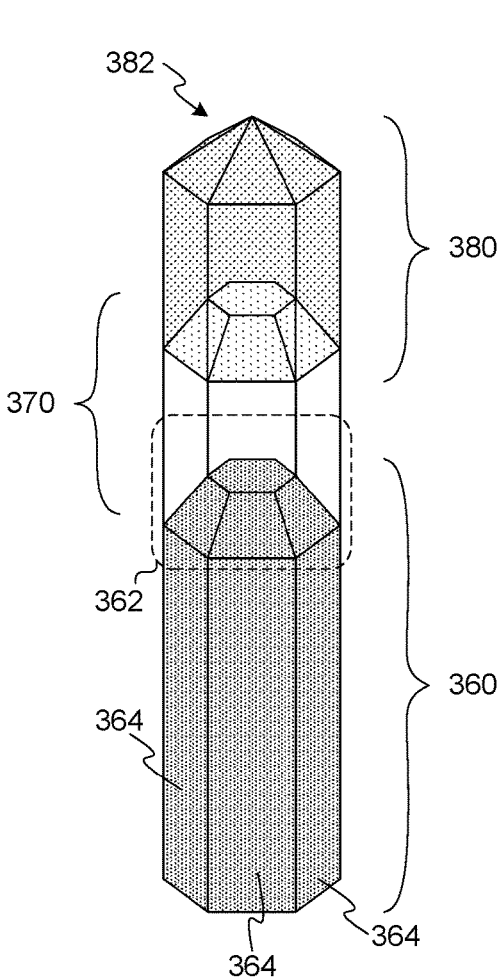
FIG. 3B
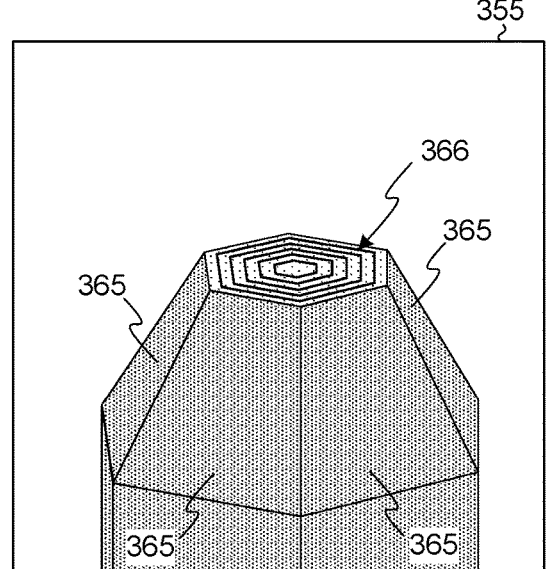

400
401     401
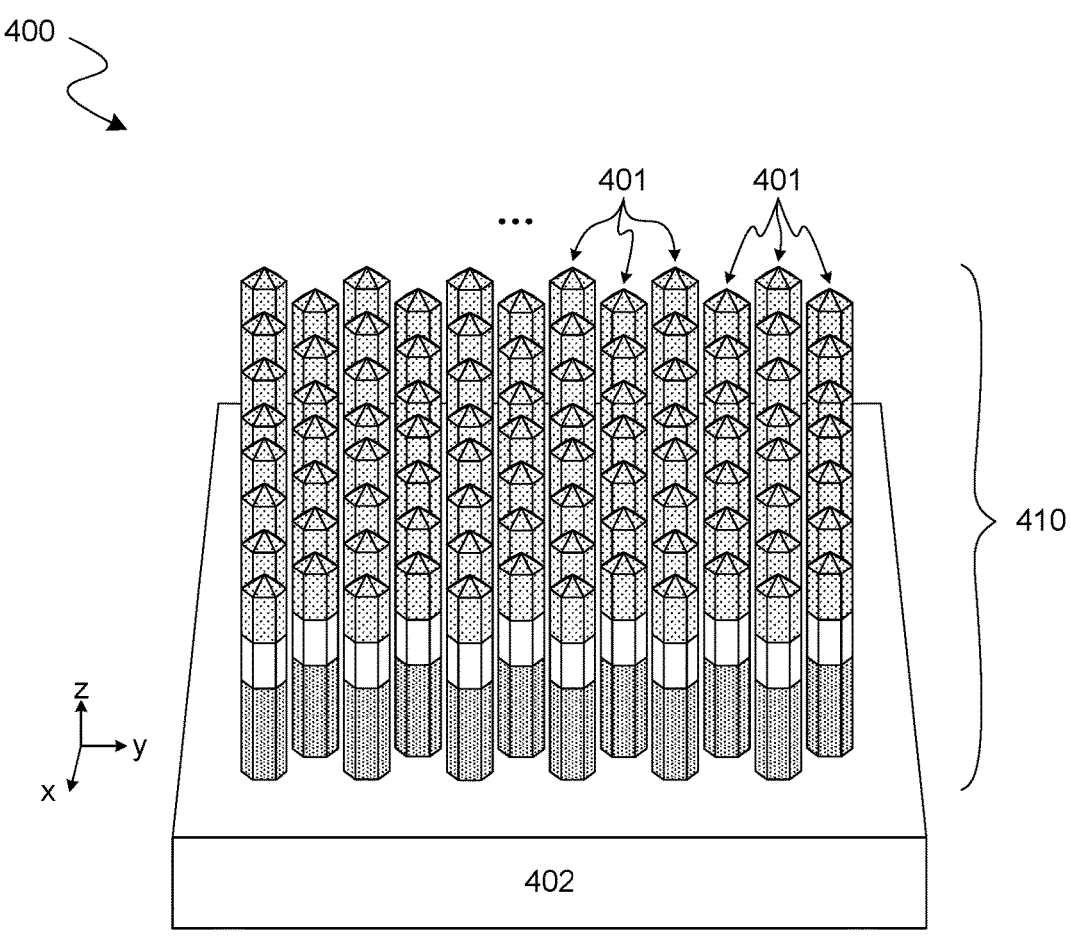
410
402
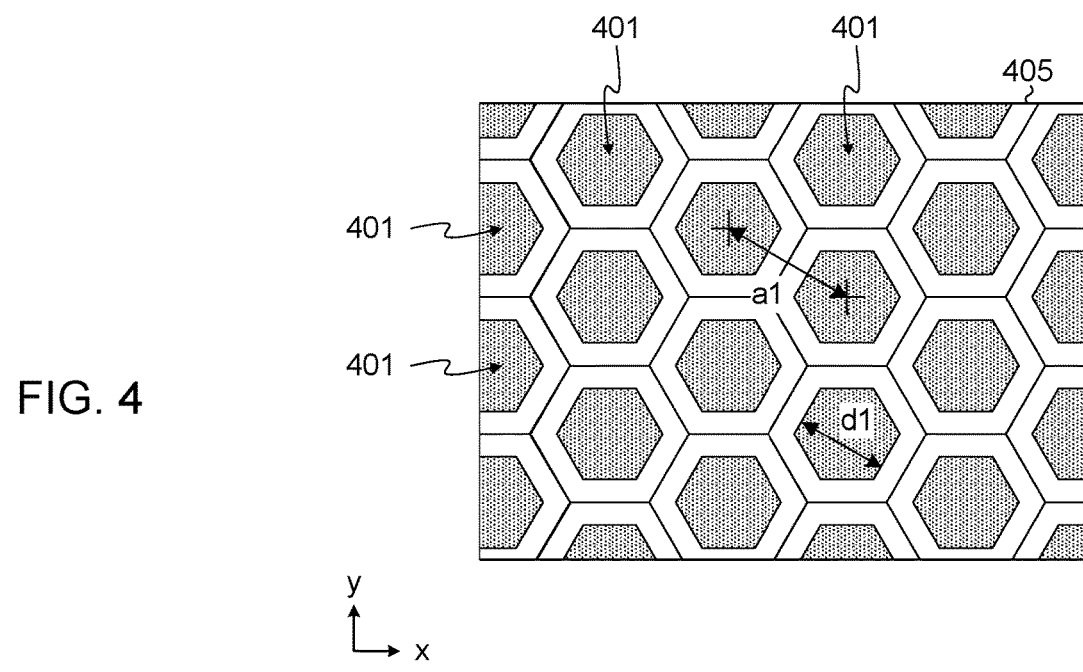
FIG. 4

505

506

600

630

620

612

601

610

605

603

655 { 656 656 656 656 656 656 656 656

654

655 {

654

653

652 z y   x

MICRO LIGHT EMITTING DIODE STRUCTURES FOR EFFICIENT COMMUNICATION OF AN OPTICAL SIGNAL

BACKGROUND

1. Technical Field

This disclosure generally relates to optical communication devices and more particularly, but not exclusively, to micro light emitting diode structures.

2. Background Art

Micro light emitting diodes ("micro-LEDs," "uLEDs" or "μLEDs") have great potential in the electronics industry due to the efficiency of their power performance. MicroLEDs have had wide use in various display applications, for example. Increasing electrical domain data rates with serializer-deserializer (SerDes) technologies are problematic in advanced platforms. Placing the mixed-signal logic which is optimal for high signal rate communications is too costly in cutting edge logic nodes and is instead moved to special nodes and multi-chip strategies are used. This in turn drives yield problems and costs to increase. Power efficiency in SerDes paths is no longer scaling well and is expected to flatten at around 4 pJ/b sustained for short-reach (<0.3 m) communications in the electrical domain.

Traditional approaches to the I/O bandwidth problem in the electrical domain are to drive higher speed electrical signals (16→32→64→112→224 GHz) with more complex encoding schemes (NRZ→PAM4) and bit error rate (BER) compensation mechanisms (CRC→FEC). In the optical domain, various technologies are being developed to provide multi-lambda encoding per optical fiber technique, with multiple fibers in parallel. Each lambda is encoded after a higher data rate electrical serializer-deserializer (SerDes) is used.

Currently, laser-based photonics are a leading candidate technology for long distance communication, such as from rack to rack in data centers, or from chip to chip. In this case, an external laser pumps light into a silicon photonics chip that takes an electrical signal from integrated circuit and produces light signals to transmit data to other chips via optical fibers. This approach brings cooling, complexity, power, and cost challenges.

Traditionally, standard laser-based silicon photonics have presented challenges in cooling and require exotic materials that are hard to reduce in cost. The physical area for laser-based photonics is also relatively large when compared to other technologies, as the laser modules and optical waveguides combined with micro-ring macros can easily require ~100 square millimeters (mm²) per 1 terabyte per second (TB/s) transported.

Work on achieving longer range (e.g., 1 meter to 3 meter) communications with uLEDs has generally been directed at developing higher-power devices, lower loss optical media, or other improvements to fundamental materials. This work has been associated with higher cost pressures and longer timeline to production readiness.

Data communications are expected to grow beyond 150 zettabyte per year (ZB/year) in 2025. Accordingly, there are expected to be increasing data network demands at all link scales, including chip-to-chip, board-to-board, and rack-to-rack. Moreover, interconnect power now dominates and limits compute and artificial intelligence (AI) systems, requiring 10-100× more energy efficient solutions. Finally, cost of single-mode optical interconnect is currently greater than 10-100× higher than desired, and in general, it is well suited for off-the-package and longer reach (greater than 10 m) applications. On the technology front, recent years have witnessed a significant advancement of micro light emitters, which presents opportunities for the development of technologies to transfer such emitters from a source wafer to a host compute (XPU) wafer. This enables the formation of heterogeneous systems which bring optics and electronics closer to improve energy efficiency by greater than 10×. This technological trend provides significant tail winds for building parallel optical I/O (OIO) links. The parallelism will match the parallel nature of the XPU on-die fabrics and will minimize energy consumed in serializing and deserializing data in and out of the XPU. Such parallel systems augment traditional low-radix photonics to address challenges for high-radix network topologies at smaller than 2 meter distances, for example.

CLAIM OF PRIORITY

The present application claims priority under 35 U.S.C. § 119(e) to U.S. Provisional Patent Application Ser. No. 63/393,771 filed Jul. 29, 2022 and entitled "TECHNIQUES AND METHODS FOR IMPROVED FABRICATION OF A MICRO-LED DEVICE," which is herein incorporated by reference in its entirety.

BRIEF DESCRIPTION OF THE DRAWINGS

The various embodiments of the present invention are illustrated by way of example, and not by way of limitation, in the figures of the accompanying drawings and in which:

FIG. 2 shows a flow diagram illustrating features of a method to provide functionality of a uLED structure according to an embodiment.

FIGS. 3A, 3B shows perspective view diagrams each illustrating features of a respective uLED structure according to a corresponding embodiment.

FIG. 4 shows a perspective view diagram illustrating features of a device comprising an array of uLED structures according to an embodiment.

DETAILED DESCRIPTION

Figure 1:
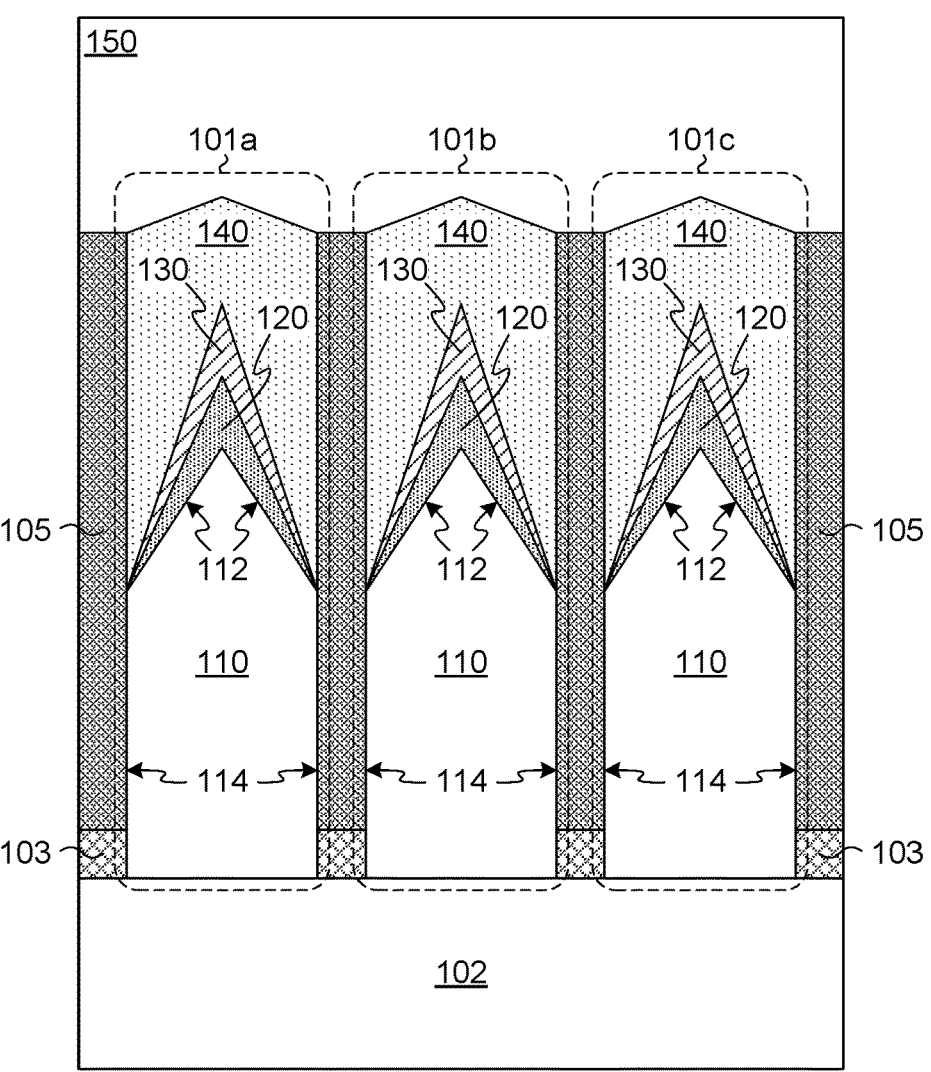
FIG. 1 shows a cross-sectional side view illustrating features of a device comprising a uLED structure according to an embodiment.

Embodiments discussed herein variously provide techniques and mechanisms for a micro-LED ("uLED") structure to facilitate efficient communication of an optical signal. Some embodiments variously adapt uLEDs for photonic communication applications (i.e., for communication with photons, as opposed to electrons). Photonic communication has strong benefits over electronic communication in that it has much higher bandwidth and faster speeds, as it does not suffer from RC delays of electronic circuits.

In various embodiments, a uLED device comprises at least one substantially columnar structure—referred to herein as a "nanowire LED" or "nanopost LED" (or as a "nanowire" or a "nanopost," for brevity)—which is operable to emit an optical signal and/or to receive another optical signal. In some embodiments, a uLED comprises multiple nanowires which are operable in combination with each other to communicate (e.g., receive or transmit) the same optical signal. For example, some embodiments variously fabricate and/or operate an array of nanowires—e.g., wherein the nanowires of the array form a pixel of only one single uLED, or wherein (alternatively) the nanowires of the array form multiple pixels each of a different respective uLED. The term "uLED structure" refers herein to some or all structures of a given uLED—e.g., wherein a uLED structure is at least a portion of a nanowire of said uLED. Unless otherwise indicated, the term "uLED structures" refers herein to structures of different respective nanowires.

In some embodiments, a given nanowire comprises contiguous bodies of semiconductor materials, wherein one or more such contiguous bodies each form a respective pyramidal structure. For example, a given one such body forms some or all of a hexagonal (or other) pyramid with semipolar planes of its semiconductor material. In one such embodiment, the contiguous bodies are arranged in a vertically stacked configuration relative to each other, wherein the respective horizontal footprints of the contiguous bodies are of the same size or, alternatively, are of successively smaller sizes according to their relative order along a vertical direction. In this particular context, a "horizontal footprint" of a given structure refers to a region, in a horizontal plane, which is overlapped by (or alternatively, which overlaps) that structure.

Accordingly, in some embodiments, a nanowire (or other such uLED structure) comprises a first doped portion, a second doped portion, and a quantum well structure between the first and second doped portions, wherein the quantum well structure does not extend to adjoin vertical sidewall structures of the first doped portion. In providing one or more pyramidal structures of a nanowire—e.g., in combination with the above-described vertically stacked arrangement of portions of said nanowire—some embodiments variously facilitate efficient communication of narrowly columnated optical signal.

Some features of various embodiments are described herein with reference to a nanowire which comprises a first contiguous body of an n-type gallium nitride (GaN) material, a second contiguous body of an undoped indium gallium nitride (InGaN) material, and a third contiguous body of a p-type GaN material. However, it is to be appreciated that, in other embodiments, such contiguous bodies comprise any of various other suitable combinations of materials, wherein the first contiguous body and the third contiguous body comprise relatively wide bandgap materials (as compared to a material of the second contiguous body), and wherein the second contiguous body is to provide some or all of a quantum well structure of the nanowire. In some embodiments, such other suitable combinations are adapted (for example) from any of various existing uLED designs.

FIG. 1 shows a cross-sectional side view of a device 100 comprising a uLED structure according to an embodiment. Device 100 illustrates an example embodiment wherein one or more uLED devices each comprise a respective nanowire structure, one end of which comprises semipolar planes that form a pyramidal structure. Such a pyramidal structure is provided, for example, with metal-organic chemical vapor deposition (MOCVD) processing to form a contiguous body of a semiconductor material, wherein the MOCVD processing is controlled to form a tapered end of the contiguous body. Structures of device 100 are shown with reference to an xyz Cartesian coordinate system. Unless otherwise indicated, "length" refers herein to a dimension along the x-axis of the coordinate system, wherein "width" and "height" refer to dimension along the y-axis and the z-axis (respectively) of the coordinate system.

As shown in FIG. 1, device 100 comprises a base structure 102 and one or more uLED structures (such as the illustrative uLED structures 101a-c shown) that extend from base structure 102. Although device 100 is shown as comprising three uLED structures 101a-c (each referred to individually as a "uLED structure 101" herein), the three are shown in this manner for illustrative purposes only. It is to be appreciated that for a pixel such as a 2×2 pixel element, for example, only two micro LEDs would be viewable for a given cross-section. It is to be appreciated that a variety of arrangements of micro LEDs may be suitable to make a single pixel. In one embodiment, three micro LEDs are arranged side-by-side, as depicted in FIG. 1. In another embodiment, four micro LEDs are arranged a 2×2 arrangement. In another embodiment, nine micro LEDs are arranged a 3×3 arrangement (e.g., three red micro LEDs, three green micro LEDs, and three blue micro LEDs), etc. It is to be appreciated that a micro LED is composed of an array of nanowire LEDs. The number of nanowire LEDs per one micro LED is at least one. In one example embodiment, a 10 micrometer (um) by 10 um micro LED is composed of 90 nanowire LEDs connected in parallel, for example, to emit light of a specific color. It is further to be appreciated that, with respect to FIG. 1, the micro LEDs are represented by one nanowire each for illustrative purposes. This in general is not the case. Typically, one micro LED will be composed of more than one nanowire LED. Also, in FIG. 1, one example arrangement is shown.

In an embodiment, base structure 102 serves as a structure on which uLED structures 101a-c are formed—e.g., wherein uLED structures 101a-c are subsequently separated from at least a portion of base structure 102 for coupling to other circuit structures and/or optical communication structures (not shown). In an illustrative scenario according to one embodiment, base structure 102 comprises a wafer and one or more material layers thereon, wherein the one or more material layers facilitate growth of uLED structures 101a-c and, for example, separation of uLED structures 101a-c from said wafer. The one or more material layers comprise a buffer layer and/or a release layer, for example. By way of illustration and not limitation, base structure 102 comprises a silicon (111) wafer and one or more of an aluminum nitride (AlN) buffer layer or a metal-based nucleation layer (MNL)—such as a titanium nitride (TiN) growth/release layer—on said silicon wafer.

In some embodiments, base structure 102 is at least a portion of a substrate structure such as that of a package substrate, an interposer, an IC die, or any of various other suitable organic, or inorganic, substrate structures. For example, base structure 102 further comprises interconnect structures (not shown) which facilitate the communication of electrical signals between uLED structures 101a-c and circuitry which device 100 includes or, alternatively, accommodates coupling to. In one such embodiment, uLED structures 101a-c are grown on another substrate structure, and subsequently transferred for coupling to base structure 102.

In the example embodiment shown, a patterned layer 103 of silicon nitride (or any of various other suitable mask materials) is deposited on base structure 102. Patterned layer 103 has formed therein aperture structures that expose portions of base structure 102—e.g., wherein circular, polygonal (for example, hexagonal) or other shapes of some or all such apertures are chosen to facilitate the formation of pyramidal structures as described herein.

In various embodiments, uLED structures 101a-c each comprise a respective doped portion 110 which, for example, is a contiguous body of a first doped, wide band gap semiconductor material. For example, one such doped portion 110 comprises a n-type doped first material which, in an embodiment, comprises gallium and nitrogen—e.g., wherein a stoichiometry of the first material is substantially equal to a stoichiometry of any of various suitable gallium nitride (GaN) compounds.

In an embodiment, doped portions 110 are formed by processing (such as a MOCVD process, for example) which is controlled to generate pyramidal structures 112—each referred to individually as a "pyramidal structure 112" herein—with respective ends of doped portions 110a-c. In one such embodiment, a pyramidal structure 112 is a pyramidal structure that is formed by semipolar planes of the first doped material. By way of illustration and not limitation, a horizontal cross-section of a pyramidal structure 112 substantially conforms to a polygon shape that comprises more than three sides (and in some embodiments, more than four sides)—e.g., wherein the polygon shape is a regular polygon such as a regular hexagon. Such pyramidal structures 112 variously facilitate a communication of a relatively narrowly columnated optical signal—e.g., as compared to optical signals communicated by various conventional uLED devices.

In an embodiment, uLED structures 101a-c each further comprise a respective one or more quantum well structures that facilitate generation of one of an optical signal or an electrical signal (where such generation is based on the other of the optical signal or the electrical signal). By way of illustration and not limitation, a uLED structure 101 further comprises a respective quantum well structure 120 which is a contiguous body of an undoped, relatively narrow band (e.g., compared to a doped portion 110), semiconductor material. For example, a quantum well structure 120 comprises a second material which, in an embodiment, comprises indium, gallium and nitrogen—e.g., wherein a stoichiometry of the second material is substantially equal to a stoichiometry of any of various suitable InGaN compounds. In various embodiments, for a given uLED structure 101, the quantum well structure 120 conforms to the pyramidal structure 112 of the adjoining doped portion 110. In the example embodiment shown, a top of a quantum well structure 120 forms another pyramidal or otherwise tapered structure—e.g., wherein a MOCVD (or other) process to deposit the undoped, narrow bandgap material is controlled to provide such a pyramidal structure.

In one such embodiment, uLED structures 101a-c each further comprise a respective barrier structure 130 which (for example) is a contiguous body of another undoped material. For example, in one such embodiment, a third, undoped material of a barrier structure 130 comprises gallium and nitrogen—e.g., wherein a stoichiometry of the third material is substantially equal to a stoichiometry of any of various suitable gallium nitride (GaN) compounds. In various embodiments, a given uLED structure 101 comprises multiple quantum well structures and (for example) multiple barrier structures interleaved with said multiple quantum well structures.

In various embodiments, uLED structures 101a-c each further comprise a respective doped portion 140 which, for example, is a contiguous body of another doped, wide band gap semiconductor material. For example, one such doped portion 140 comprises a p-type doped fourth material which, in an embodiment, comprises gallium and nitrogen—e.g., wherein a stoichiometry of the first material is substantially equal to a stoichiometry of any of various suitable gallium nitride (GaN) compounds. In some embodiments, to facilitate a communication of an optical signal, device 100 further comprises a transparent layer 150 which extends over the respective doped portions 140 of uLED structures 101a-c. In one such embodiment, transparent layer 150 is a layer of indium tin oxide (ITO), gallium doped zinc oxide (GZO) or any of various other suitable materials.

In various embodiments, one or more pyramidal structures of a uLED structure 101—e.g., including the pyramidal structure 112 formed by a doped portion 110 of said uLED structure 101—facilitate a communication of relatively tightly columnated optical signal to or from that uLED structure 101. In some embodiments, communication of such a tightly columnated optical signal is additionally or alternatively facilitated with a vertically stacked arrangement of portions of the uLED structure 101.

In one such arrangement, respective horizontal footprints of such portions are of the same size, or are successively smaller, according to an order of said portions relative to each other (e.g., along a vertical line of direction away from base structure 102). By way of illustration and not limitation, for a given uLED structure 101, a first footprint of the doped portion 110 in a horizontal (x-y) plane is greater than or equal to a second footprint of the quantum well structure 120. In one such embodiment, the first footprint completely overlaps the second footprint—e.g., wherein sidewall portions of doped portion 110, said sidewall portions vertically below pyramidal structure 112, remain exposed by quantum well structure 120 (that is, quantum well structure 120 does not extend to adjoin said sidewall portions). In one such embodiment, the second footprint of quantum well structure 120 is greater than or equal to a third footprint of the barrier structure 130—e.g., wherein the second footprint completely overlaps the third footprint. Alternatively or in addition, the third footprint of barrier structure 130 is greater than or equal to a fourth footprint of doped portion 140—e.g., wherein the third footprint completely overlaps the fourth footprint.

Accordingly, in some embodiments, the doped portion 110 of a uLED structure 101 has sidewall structures 114—vertically below the pyramidal structure 112—which are not overlapped by any of the quantum well structure 120, the barrier structure 130, or the doped portion 140. In the example embodiment shown, such sidewall structures 114 of said uLED structure 101 instead adjoin other structures, such as the illustrative dielectric structure 105 shown. In an embodiment, dielectric structure 105 is a fill dielectric which (for example) comprises silicon oxide and/or any of various other suitable electrical insulation materials.

In providing such a vertically stacked arrangement of a doped portion 110, a quantum well structure 120, a doped portion 140 and (in some embodiments) a barrier structure 130—e.g., wherein the doped portion 110 forms a pyramidal structure 112 and sidewall structures 114 which are not covered by the quantum well structure 120 or the barrier structure 130—some embodiments prevent or otherwise mitigate a communication of an optical signal via vertical sides of the uLED structure 101, but instead promote optical signal communication via a top side of that uLED structure 101.

FIG. 2 shows a method 200 for providing uLED functionality according to an embodiment. Operations of method 200 are performed, for example, to provide and/or use optical communication structures such as some or all of those provided with device 100.

In some embodiments, method 200 comprises operations 202 for fabricating and/or otherwise providing one or more uLED structures, which each comprise a respective pyramidal structure and/or a respective vertically stacked arrangement of structures to facilitate efficient optical signal communication. As shown in FIG. 2, operations 202 comprise (at 210) forming a first body of a doped first semiconductor material on a substrate structure. For example, the first body is formed at 210 by a MOCVD process, or any of various other other suitable processes to deposit the first semiconductor material on the substrate structure—e.g., through an aperture of a patterned mask on said substrate structure. By way of illustration and not limitation, doped portion 110 is formed on base structure 102 by the forming at 210. The first semiconductor material comprises gallium nitride or any of various other suitable wide band gap materials which, for example, are adapted from conventional uLED designs.

In various embodiments, a surface of the substrate structure extends in a first horizontal (x-y) plane, wherein the first body is grown at 210 in a vertical (z-axis) direction from said surface. The forming at 210 comprises controlling MOCVD (or other) processing to form a pyramidal structure of the first body—e.g., wherein semipolar planes of the first semiconductor material form respective obliquely angled facets of said pyramidal structure. For example, the first body comprises the pyramidal structure and vertical sidewall structures which variously extend vertically between the pyramidal structure and substrate structure (e.g., wherein the first body comprises a pyramidal structure 112 and vertical sidewall structures 114).

In an embodiment, the pyramidal structure is a truncated pyramid structure or, alternatively, is a non-truncated pyramidal structure. For example, a horizontal cross-section of the first body substantially conforms to a polygon, such as a regular hexagon or any of various other regular polygons. In one such embodiment, in a horizontal plane, the vertical sidewall structures each extend to a respective edge of a hexagon (or other such polygon).

Operations 202 further comprise (at 212) forming a second body of an undoped second semiconductor material on the pyramidal structure. By way of illustration and not limitation, the second body corresponds functionally to quantum well structure 120, for example. In some embodiments, forming the second body comprises forming one or more quantum well structures of the uLED structure and, in some embodiments, further forming one or more barrier layers (e.g., comprising barrier structure 130) which each adjoin a respective one of said one or more quantum well structures.

The forming at 212 comprises performing MOCVD (or other) processing to deposit the second semiconductor material which, in an embodiment, is a relatively narrow band gap material, as compared to the first semiconductor material. The second body is to provide a quantum well structure of a nanopost, for example. In some embodiments, a top side of the second body forms a pyramidal, conical or otherwise tapered structure which, for example, comprises obliquely angled facets. In one such embodiment, the tapered structure has a same slope (or alternatively, a steeper slope) than that of an underlying facet of the first body.

In some embodiments, after the forming at 212, one or more vertical sidewall structures of the first body are vertically between the substrate structure and a closest portion of the second body to the substrate structure. In one such embodiment, the second body is disposed on the pyramidal structure, but does not extend at all (or, for example, at least not entirely) over the one or more vertical sidewall structures. By way of illustration and not limitation, a pressure and/or flow of MOCVD processing is controlled to mitigate or otherwise prevent the second semiconductor material from being deposited on vertical surfaces of the first body. Accordingly, some or all of the one or more vertical sidewall structures remain exposed by the second semiconductor material (but may, for example, be covered by another structure). For example, in some embodiments, a first horizontal footprint of the first body completely overlaps a second horizontal footprint of the second body—e.g., wherein a size of the first horizontal footprint is equal to or greater than the second horizontal footprint.

Operations 202 further comprise (at 214) forming a third body of a doped third semiconductor material on the second portion. By way of illustration and not limitation, the third body corresponds functionally to doped portion 140, in some embodiments. The forming at 214 comprises performing MOCVD (or other) processing to deposit the third semiconductor material which, in an embodiment, is a relatively wide band gap material, as compared to the second semiconductor material.

In various embodiments, a dopant type of the doped third semiconductor material is opposite to a dopant type of the doped first semiconductor material—e.g., wherein the first body comprises an n-type doped material, and wherein the third body comprises a p-type doped material. In one such embodiment, despite the different respective dopant types, the first semiconductor material is the same as the third semiconductor material—e.g., a stoichiometry of the first semiconductor material and a stoichiometry of the third semiconductor material are each substantially equal to a stoichiometry of any of various suitable gallium nitride (GaN) compounds.

In some embodiments, after the forming at 214, one or more vertical sidewall structures of the first body are vertically between the substrate structure and a closest portion of the third body to the substrate structure. In one such embodiment, the third body is disposed on the second body (or, for example, on a barrier layer formed on the second body), but does not extend at all—or at least not entirely—over the one or more vertical sidewall structures. For example, MOCVD processing is controlled to mitigate or otherwise prevent the third semiconductor material from being deposited on vertical surfaces of the first body. In some embodiments, the second horizontal footprint of the first body completely overlaps a third horizontal footprint of the third body—e.g., wherein a size of the second horizontal footprint is equal to or greater than the third horizontal footprint.

In various embodiments, multiple instances of operations 202 are performed—e.g., concurrently or in series—to form an array of multiple uLED structures which extend vertically from the substrate structure. In one such embodiment, an arrangement of the multiple uLED structures conforms to an arrangement of polygonal tiles in a regular tessellation pattern—e.g., wherein the polygonal tiles are hexagonal tiles. In providing such a polygonal arrangement of uLED structures, some embodiments further facilitate an efficient communication of an optical signal which is relatively narrowly columnated—e.g., as compared to optical signals communicated with various conventional uLED designs.

In some embodiments, operations 202 further comprise additional processing (not shown) to form one or more structures on a uLED structure—e.g., a nanopost—which comprises the first body, the second body, and the third body. By way of illustration and not limitation, operations 202 further comprise forming a layer of a transparent conductive material which extends over the uLED structure. In one such embodiment, operations 202 further comprise forming, on the layer of the transparent conductive material, another layer of a material comprising quantum dots. In providing such a material layer comprising quantum dots, some embodiments variously support optical signal communications with wavelength conversion functionality.

Additionally or alternatively, method 200 further comprises coupling uLED structures (such as those generated according to operations 202) to integrated circuitry which facilitates the receiving or transmitting of an optical signal with said uLED structures. In one such embodiment, the integrated circuitry provides functionality to variously operate a given uLED structure, at different times, in different ones of an optical signal receiver (sensor) mode or an optical signal transmitter (emitter) mode. For example, the integrated circuitry is operable to provide a first voltage bias across the uLED structure to enable one such mode, and to provide a reverse voltage bias across the uLED structure to instead enable the other such mode. In a receiver mode, the uLED structure is operable to generate an electrical signal based on a received optical signal, whereas, in a transmitter mode, the uLED structure is operable to instead generate an optical signal based on a received electrical signal.

For example, in various embodiments, method 200 additionally or alternatively comprises operations 204 for performing communications with uLED structures such as those provided by operations 202. In one such embodiment, operations 204 comprise (at 216) communicating a first optical signal with the uLED structure, wherein the first optical signal is propagated in a first direction (for example, vertically toward or from the uLED structure). Additionally or alternatively, operations 204 comprise (at 218) communicating a second optical signal with the uLED structure, wherein the second optical signal is propagated in a second direction which is opposite the first direction.

Figure 3A:
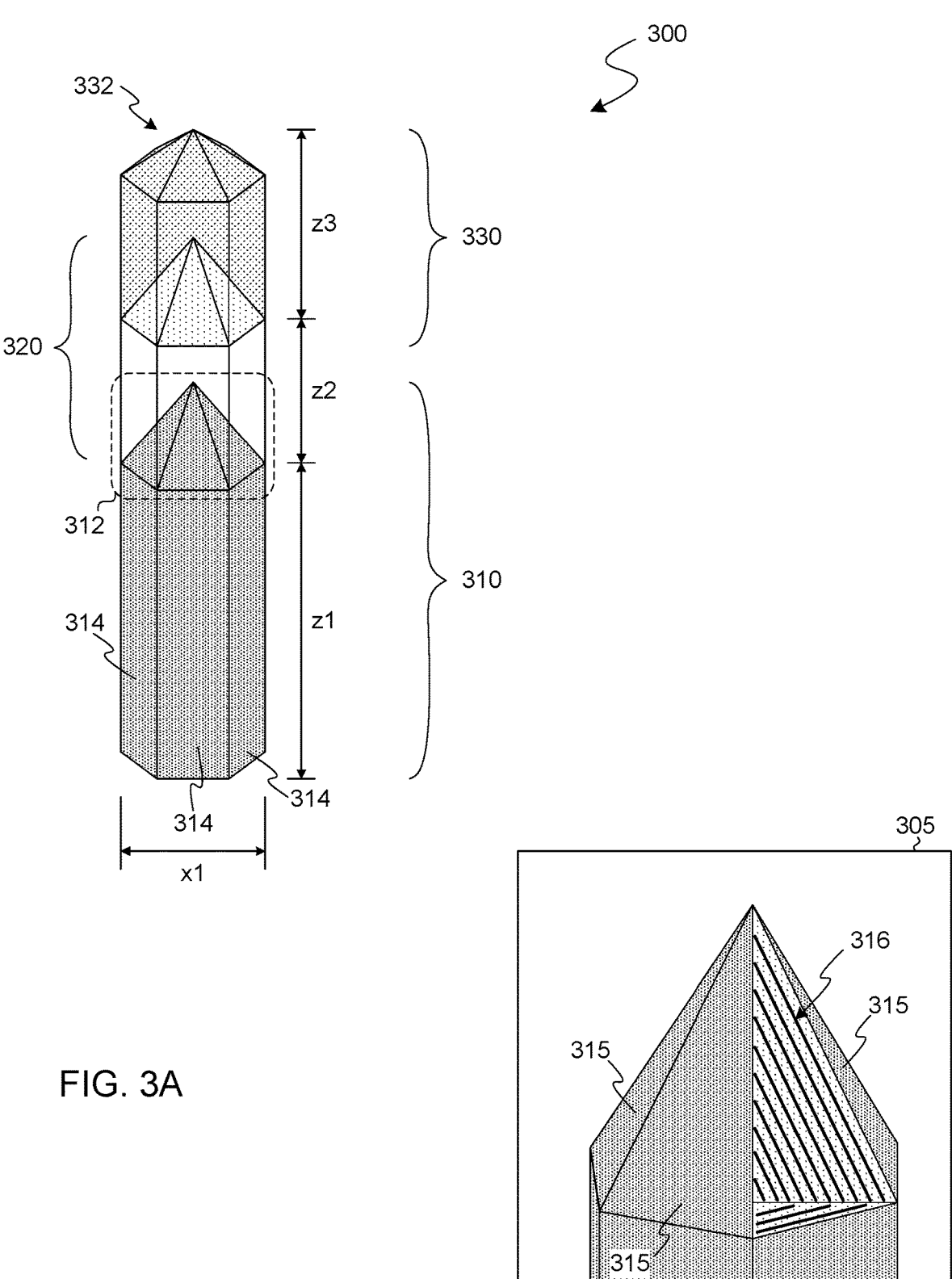

FIG. 3A shows a perspective view of a uLED structure 300 which is to facilitate communication of an optical signal according to an embodiment. The uLED structure 300 illustrates features of one example embodiment wherein a nanopost LED (for example) comprises at least one semiconductor structure which forms a pyramidal structure, and wherein multiple semiconductor structures are arranged in a vertically stacked configuration—e.g., as opposed to a core/shell(s) arrangement. In some embodiments, uLED structure 300 provides functionality such as that of one of uLED structures 101$a$-$c$—e.g., wherein operations of method 200 are performed with, or provide structures of, uLED structure 300.

As shown in FIG. 3A, uLED structure 300 comprises doped portions 310, 330, and a well structure 320 which is located vertically between doped portions 310, 330. For example, doped portion 310, well structure 320, and doped portion 330 correspond functionally to doped portion 110, quantum well structure 120, and doped portion 140 (respectively). In an alternative embodiment, uLED structure 300 further comprises a barrier layer (such as barrier structure 130) which is between well structure 320 and doped portion 330. Doped portion 310 comprises a doped first semiconductor material which is a relatively wide band gap material, as compared to a second semiconductor material of well structure 320.

In the example embodiment shown, a pyramidal structure 312 of doped portion 310 is formed by the first semiconductor material. More particularly, as illustrated in detail view 305, semipolar planes 316 of the first semiconductor material variously form obliquely angled facets 315 of pyramidal structure 312—e.g., wherein, along a vertical (z axis) dimension, vertical sidewalls 314 of doped portion 310 are between facets 315 and an underlying substrate structure (not shown). In this example embodiment, pyramidal structure 312 is a non-truncated pyramid structure—e.g., wherein the obliquely angled facets 315 meet to form a point at a top of pyramidal structure 312.

In an embodiment, well structure 320 is formed on (and, for example, adjoins) facets 315 of pyramidal structure 312, but well structure 320 fails to further extend along at least part of—and in some embodiments, any of—the vertical sidewalls 314. For example, at least a portion of vertical sidewalls 314 is vertically between an underlying substrate structure (not shown) and that portion of well structure 320 which is a closest portion of well structure 320 to said substrate structure. Accordingly, said portion of vertical sidewalls 314 remains exposed by well structure 320 but, for example, may instead be covered by some other structure (not shown) that is distinct from, but which adjoins, uLED structure 300.

In one such embodiment, doped portion 330 is formed on well structure 320, but doped portion 330 also fails to further extend along at least part of—and in some embodiments, any of—the vertical sidewalls 314. Accordingly, some portion of vertical sidewalls 314 also remain exposed by doped portion 330 but, for example, may instead be covered by some other structure (not shown). In one such embodiment, a first horizontal footprint of doped portion 310 is greater than or equal to a second horizontal footprint of well structure 320 (and, for example, is greater than or equal to a third horizontal footprint of doped portion 330). For example, the first horizontal completely overlaps the second horizontal footprint (and/or completely overlaps the third horizontal footprint), in some embodiments.

In providing such a vertically stacked arrangement of doped portions 310, 330 and well structure 320, some embodiments mitigate the communication of an optical signal via the sides of uLED structure 300, and instead promote such communication via a distal end 332 of uLED structure 300. In some embodiments, this vertically stacked arrangement further facilitates a space efficient packing of multiple uLED structures into an array of optical signaling devices.

In an illustrative scenario according to one embodiment, a horizontal dimension x1 of doped portion 310 is in a range of 100 nm to 400 nm—e.g., wherein a vertical height z1 of doped portion 310 is in a range of 1 um to 10 um. In one such embodiment, a vertical height z2 of well structure 320 is in a range of 1 nm to 5 nm—e.g., wherein a vertical height z3 of doped portion 330 is in a range of 50 nm to 150 nm. However, it is to be appreciated that uLED structure 300 includes any of various other suitable dimensions, in some alternative embodiments.

FIG. 3B shows a perspective view of a uLED structure 350 which is to facilitate communication of an optical signal according to another embodiment. The uLED structure 350 illustrates features of one example embodiment wherein uLED structure comprises a semiconductor structure which forms a truncated pyramidal structure, wherein multiple semiconductor structures are arranged in a vertically stacked configuration. In some embodiments, uLED structure 350 provides functionality such as that of one of uLED structures 101a-c—e.g., wherein operations of method 200 are performed with, or provide structures of, uLED structure 350.

As shown in FIG. 3B, uLED structure 350 comprises doped portions 360, 380, and a well structure 370 which is located vertically between doped portions 360, 380. For example, doped portion 360, well structure 370, and doped portion 380 correspond functionally to doped portion 110, quantum well structure 120, and doped portion 140 (respectively). A pyramidal structure 362 of doped portion 360 is formed by a first semiconductor material. More particularly, as illustrated in detail view 355, semipolar planes 366 of the first semiconductor material variously form obliquely angled facets 365 of pyramidal structure 362. In this example embodiment, pyramidal structure 362 is a truncated pyramid structure, wherein the obliquely angled facets 365 variously stop at a horizontal facet (rather than meeting to form any point) at a top of pyramidal structure 362.

In an embodiment, well structure 370 fails to further extend along at least part of—and in some embodiments, any of—vertical sidewalls 364 of doped portion 360. Similarly, doped portion 380 also fails to extend along at least part of the vertical sidewalls 364. Accordingly, at least some portion of vertical sidewalls 364 remain exposed both by well structure 370 and by doped portion 380 but, for example, may instead be covered by some other structure (not shown) which is distinct from, but which adjoins, uLED structure 350. In one such embodiment, a first horizontal footprint of doped portion 360 is greater than or equal to a second horizontal footprint of well structure 370 (and, for example, is greater than or equal to a third horizontal footprint of doped portion 380). For example, the first horizontal completely overlaps the second horizontal footprint (and/or completely overlaps the third horizontal footprint), in some embodiments. The vertically stacked arrangement of doped portions 360, 370 and well structure 380 promotes efficient optical communication via a distal end 382 of uLED structure 350, and/or facilitates a space efficient packing of uLED structures, in some embodiments.

FIG. 4 shows a perspective view of a device 400 which comprises an array of uLED structures according to an embodiment. Device 400 illustrates features of one example embodiment wherein uLED structures each comprise a respective pyramid structure in a respective vertically stacked arrangement of semiconductor bodies. In some embodiments, device 400 provides functionality similar to that of a uLED structure 101, of uLED structure 300, or of uLED structure 350—e.g., wherein operations of method 200 are to manufacture and/or use structures of device 400.

As shown in FIG. 4, device 400 comprises a base structure 402 and an array 410 of uLED structures 401 which variously extend vertically from a horizontal surface of base structure 402. In one such embodiment, base structure 402 corresponds functionally to base structure 102—e.g., wherein uLED structures 401 variously provide optical communication functionality such as that provided by uLED structures 101a-c. For a given one of uLED structures 401, the uLED structure 401 comprises a vertically stacked arrangement of respective semiconductor bodies. For example, the given uLED structure 401 includes a first body—e.g., one of doped portions 110, 310, 360— of a doped wide bandgap material (such as GaN), wherein a top portion of the first body forms a pyramidal or otherwise tapered structure. In one such embodiment, the given uLED structure 401 further comprises other bodies of respective semiconductor materials which are variously arranged vertically over the first body, wherein vertical sidewalls of the first body remain at least partially exposed by said other bodies.

An inset 405 in FIG. 4 shows a detail view 405 of a horizontal (x-y) cross-section of a part of array 410. As illustrated by inset 405, an arrangement of uLED structures 401 in array 410 conforms to an arrangement of polygonal (in this example embodiment, hexagonal) tiles in a regular tessellation pattern. In so arranging the uLED structures 401, some embodiments variously provide structures that are able to produce a very narrow linewidth and very directional beam from array 410. Additionally or alternatively, in providing vertically stacked arrangements (as opposed to core/shell arrangements) of respective semiconductor bodies, uLED structures 401 accommodate a relatively space efficient arrangement in array 410. In an illustrative scenario according to one embodiment, a horizontal length d1 (e.g., a distance between opposing sidewalls) of a given uLED structure 401 is in a range of 100 nm to 400 nm—e.g., wherein a distance a1 between neighboring uLED structures 401 is in a range of 1 um to 10 um.

As further shown in detail view 405, a horizontal cross-section of a given uLED structure 401 substantially conforms to a regular hexagon (or any of various other suitable regular polygons). In one example embodiment, the cross-section shown in detail view 405 includes respective horizontal footprints of a doped portion 110 of a uLED structure 101—e.g., wherein the area of said horizontal footprints is greater than or equal to horizontal footprint of a quantum well structure 120 of that same uLED structure 101.

FIGS. 5A-5G show various cross-sectional side views of structures each during a respective one of multiple stages 500 through 506 of processing to fabricate uLED structures according to an embodiment. Stages 500 through 506 illustrates one example of an embodiment which forms a uLED structure (such as some or all of a nanopost) comprising a pyramidal structure in a vertically stacked arrangement of semiconductor bodies. In various embodiments, processing such as that illustrated by stages 500 through 506 provides a uLED structure 101, or one of uLED structures 300, 350, 401—e.g., wherein said processing includes some or all of operations 202. Structures during stages 500 through 506 are shown with reference to an xyz Cartesian coordinate system.

Figures 5A, 5B, 5C:
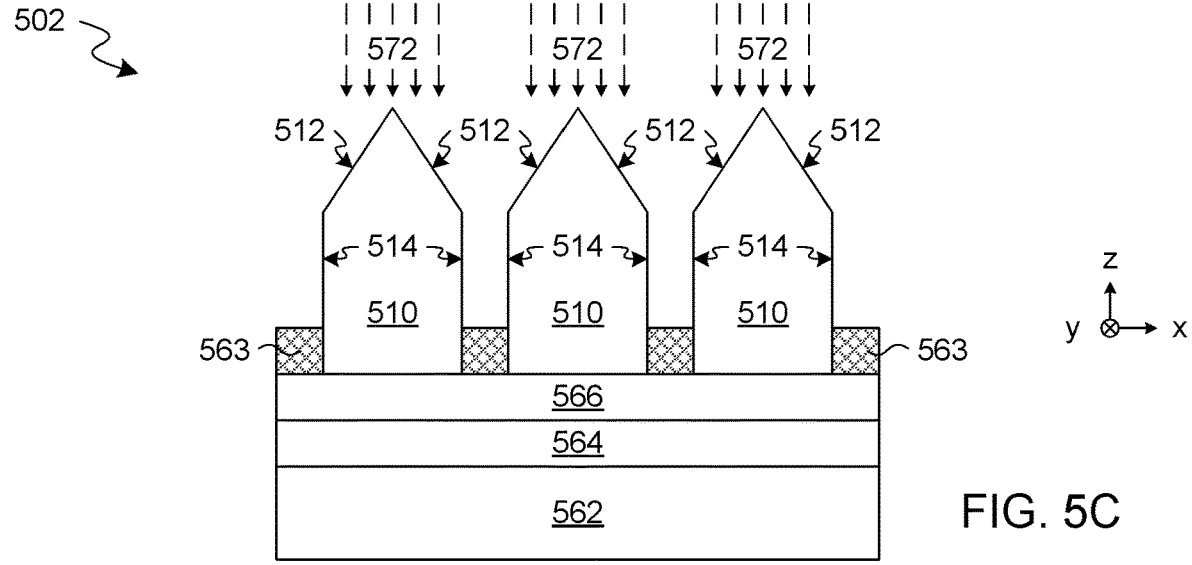
FIGS. 5A-5G show cross-sectional side views of structures each during a respective stages of processing to fabricate uLED structures according to an embodiment.
Figure 5D:
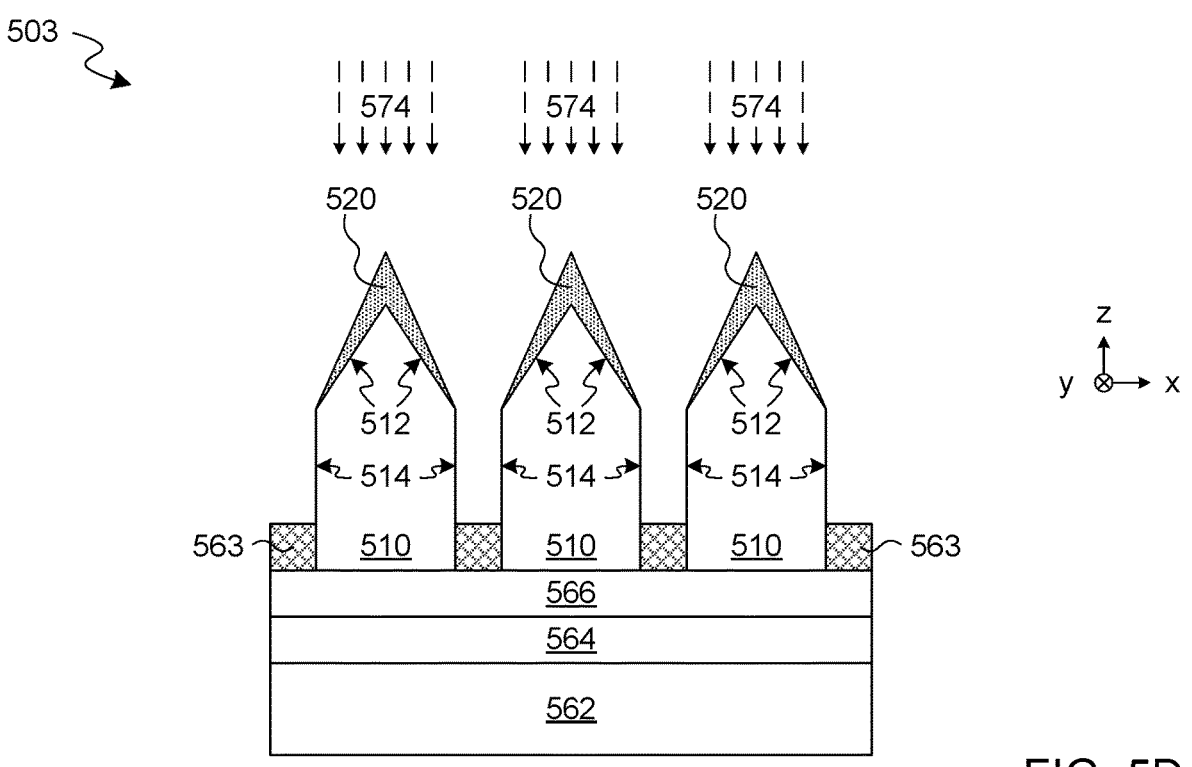
Figure 5E:
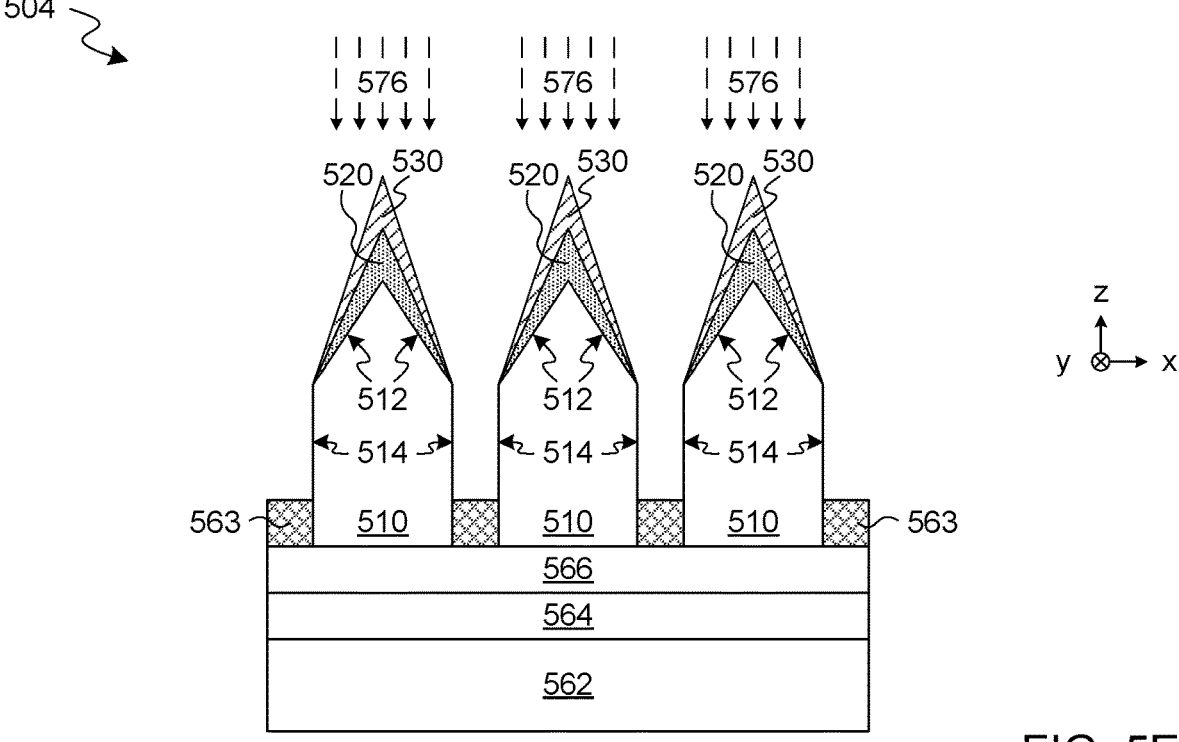

As shown in FIG. 5A, any of various suitable deposition and lithography processes are performed to form a patterned mask 563 which, at stage 500, is on a substrate structure (such as base structure 102, for example). In the example embodiment shown, the substrate structure comprises a silicon (Si) wafer 562, a buffer layer 564, and a release layer 566. In various embodiments, buffer layer 564 is formed a top surface of Si wafer 562—e.g., wherein the top surface is formed by a (111) plane of a bulk silicon crystal. In one such embodiment, buffer layer 564 comprises aluminum and nitrogen—e.g., wherein a stoichiometry of buffer layer 564 is substantially equal to that of aluminum nitride (AlN) or any of various other suitable materials. Furthermore, release layer 566 is formed on buffer layer 564—e.g., wherein release layer 566 comprises nitrogen and any of various suitable metals such as one of titanium, niobium, tantalum, hafnium, zirconium, or the like. In an embodiment, a stoichiometry of release layer 566 is substantially the same as that of TiN, NbN, TaN, HfN, or ZrN (for example).

During stage 500, a deposition 570 is performed to deposit a doped first semiconductor material (such as n-type doped GaN)—e.g., wherein deposition 570 comprises a MOCVD process or any of various other suitable processes.

Referring to the stage 501 shown in FIG. 5B, during deposition 570, amounts 511 of the doped first semiconductor material begin to grow vertically from surface portions of release layer 566 which are exposed by openings 560 formed in patterned mask 563.

At the stage 502 shown in FIG. 5C, doped portions 510 (referred to herein individually each as "doped portion 510") are formed by the deposition 570. A given doped portion 510 comprises a respective pyramidal structure 512 and respective vertical sidewall structures 514 which variously extend vertically between the pyramidal structure 512 and release layer 566. By way of illustration and not limitation, a horizontal cross-section of a doped portion 510 substantially conforms to a regular polygon such as a hexagon—e.g., wherein the cross-section is through the pyramidal structure 512 or, alternatively, through the vertical sidewall structure 514 of the doped portion 510. In an embodiment, MOCVD processing is controlled to form a pyramidal structure 512 with semipolar planes of the first semiconductor material. In an illustrative scenario according to one embodiment, a length (x-axis) of one doped portion 510 is in a range of 100 nm to 400 nm—e.g., wherein a height (z-axis) of doped portion 510 is in a range of 1 um to 10.

During stage 502, another deposition 572 is performed to deposit an undoped semiconductor material (such as InGaN) on the respective pyramidal structures 512 of doped portions 510—e.g., wherein deposition 572 comprises a MOCVD process or any of various other suitable processes. At the stage 503 shown in FIG. 5D, deposition 572 has resulted in the formation of quantum well structures 520 each on a respective one of the pyramidal structures 512. In one embodiment, deposition 572 comprises controlling one or more parameters of a MOCVD process (e.g., the one or more parameters comprising pressure, material flow, temperature and/or the like) to prevent or otherwise mitigate a deposition of the undoped semiconductor material on the vertical sidewall structures 514. For example, the vertical sidewall structures 514 of the doped portions 510 remain partially or entirely exposed by the quantum well structures 520 at stage 503.

In an illustrative scenario according to one embodiment, a thickness (z-axis) of quantum well structure 520 is in a range of 1 nm to 5 nm. In some embodiments, performance characteristics of quantum well structures 520 are determined at least in part by a composition of the undoped semiconductor material. By way of illustration and not limitation, the fabrication processes shown are to form a uLED structure which includes one quantum well structure 520 wherein, in one embodiment, a wavelength of an optical signal generated with a uLED structure is based on amount of indium as a mole fraction of quantum well structure 520. For example, a 20% indium fraction results in said wavelength being substantially equal to 450 nm, in some embodiments.

During stage 503, another deposition 574 is performed to deposit another undoped semiconductor material (such as GaN) on the quantum well structures 520—e.g., wherein deposition 574 comprises a MOCVD process or any of various other suitable processes. As shown by the stage 504 in FIG. 5E, deposition 574 has resulted in the formation of barrier structures 530 each on a respective one of the quantum well structures 520. For example, a maximum thickness (z-axis) of a barrier structure 530 is in a range of 10 nm to 20 nm, in one example embodiment.

During stage 504, another deposition 576 is performed to deposit a doped second semiconductor material (such as p-type doped GaN)—e.g., wherein deposition 576 comprises a MOCVD process or any of various other suitable processes. As shown by the stage 505 in FIG. deposition 576 has resulted in the formation of doped portions 540 each on a respective one of the barrier structures 530. For example, a thickness (z-axis) of a doped portion 540 is in a range of 50 nm to 150 nm, in one example embodiment.

As illustrated in stage stage 505, uLED structures each comprise a respective doped portion 510, quantum well structure 520, barrier structure 530, and doped portion 540, which are arranged in a vertically stacked configuration relative to each other. In an example embodiment, a pitch of the uLED structures (e.g., along the x-axis shown) is in a range of 1 um to 10 um.

For a given on such uLED structure, the quantum well structure 520 is between the doped portion 510 and the doped portion 540. The vertical sidewall structures 514 of the doped portion 510 form at least a portion of external sidewalls of the uLED structure. For example, the quantum well structure 520 is formed on the pyramidal structure 512 of the doped portion 510, but fails to further extend over some or all of the vertical sidewall structures 514. Accordingly, at least some portions of the vertical sidewall structures 514 are vertically between the release layer 566 and a closest portion of the quantum well structure 520 to the release layer 566. In one such embodiment, the barrier structure 530 and the doped portion 540 similarly fail to cover at least some of the vertical sidewall structures 514.

In some embodiments, a first horizontal footprint of the doped portion 510 is greater than or equal to a second horizontal footprint of the quantum well structure 520 (and, for example, is greater than or equal to a third horizontal footprint of the doped portion 540). Additionally or alternatively, the first horizontal footprint completely overlaps the second horizontal footprint (and, in some embodiments, the third horizontal footprint).

Figure 5F:
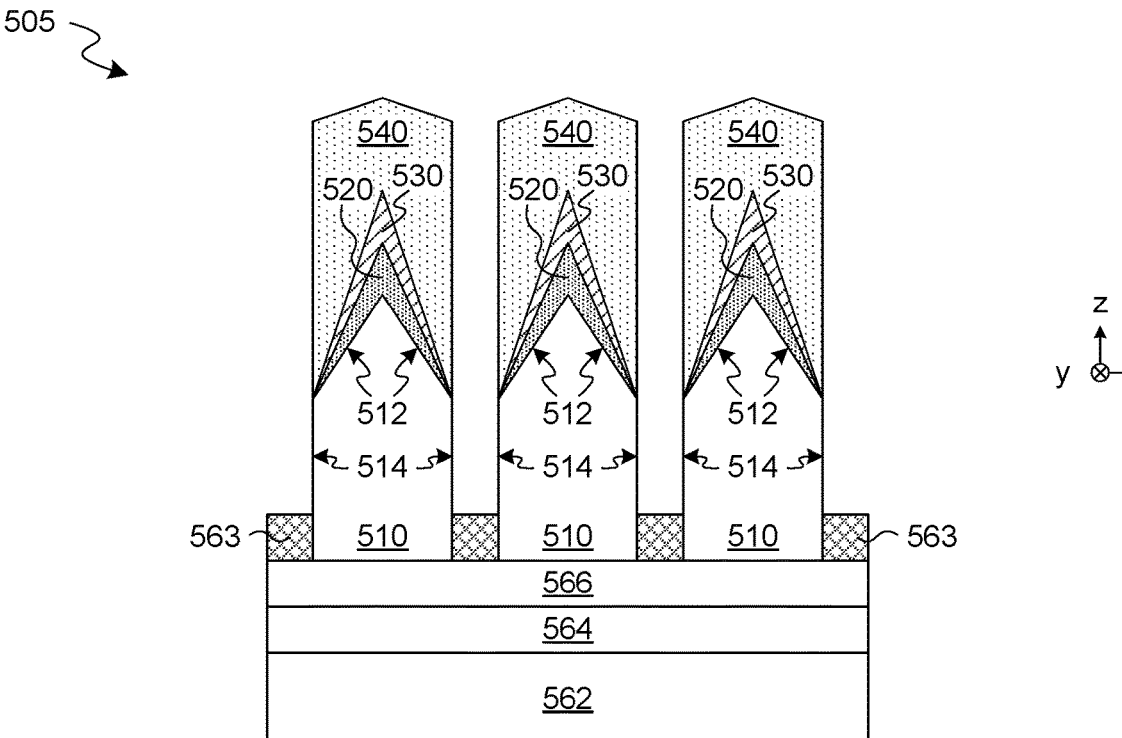
Figure 5G:
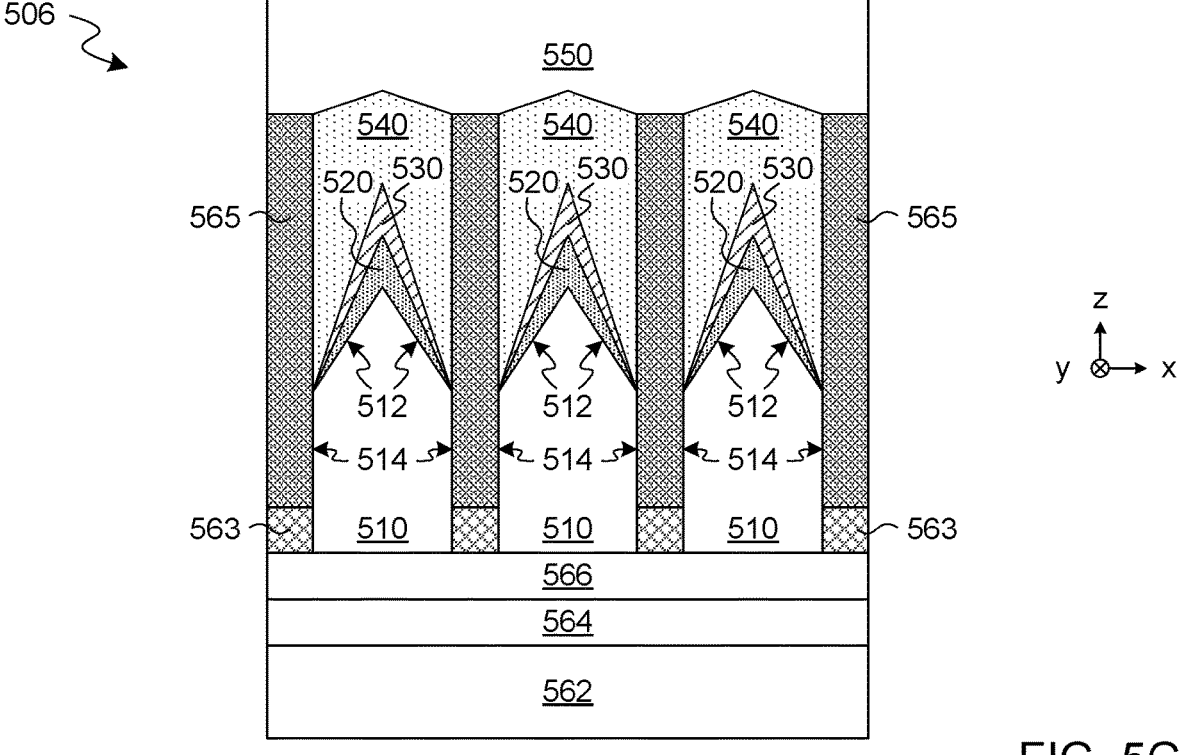

Referring now to FIG. 5F, at stage 505 additional structures are variously formed between and/or over the uLED structures. In the example embodiment shown, such additional structures comprise fill dielectric structures 565 which variously extend to provide at least partial electrical insulation between the uLED structures. Alternatively or in addition, such additional structures comprise a layer 550 of a transparent conductor such as indium tin oxide (ITO) or gallium doped zinc oxide (GZO)—e.g., wherein a thickness (z-axis) of transparent layer 550 is in a range of 100 nm to 200 nm. In one such embodiment, transparent layer 550 is formed by any of various suitable deposition processes including, but not limited to, atomic layer deposition (ALD), plasma enhanced chemical vapor deposition (PECVD), and physical vapor deposition (PVD).

Figure 6:
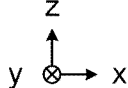
FIG. 6 shows a cross-sectional side view diagram illustrating features of a device to communicate an optical signal according to an embodiment.

FIG. 6 shows a cross-sectional side view diagram illustrating features of a device to perform wavelength conversion for an optical signal which is communicated with a ULED structure according to an embodiment. In some embodiments, device 600 provides functionality such as that of uLED structures 101*a-c*, uLED structure 300, uLED structure 350, or device 400—e.g., wherein operations of method 200 are performed with, or provide structures of, device 600. For example, processing such as that illustrated by stages 500-506 provide some or all of the structures of device 600.

As shown in FIG. 6, device 600 comprises a semiconductor substrate 652 and an active layer 653 which is formed on substrate 652. Device 600 further comprises an array 610 of uLED structures—e.g., including uLED structure 601— which are coupled to active layer 653 via metallization layers 655 and isolation layers 654 (for example). The uLED structures variously extend from respective openings in a patterned layer 603—e.g., wherein one or more dielectric structures 105 variously extend between said uLED structures.

In an embodiment, electrical signals are variously communicated, between integrated circuitry of active layer 653 and uLED structures of array 610, via conductive interconnect structures (e.g., including the illustrative via structures 656) which are formed in metallization layers 655. Electrical insulation is provided, between various ones of said conductive interconnect structures, at least in part with dielectric isolation layers 654 which are interleaved with metallization layers 655.

In various embodiments, active layer 653 comprises integrated circuitry to operate an array 610 of uLED structures which, for example, correspond functionally to uLED structures 101a-c. In one such embodiment, the integrated circuitry provides functionality to variously operate one or more uLED structures of array 610, at different times, in either one of an optical signal receiver (sensor) mode or an optical signal transmitter (emitter) mode. For example, the integrated circuitry is operable to provide a first voltage bias across the one or more uLED structures to enable one such mode, and to provide a reverse voltage bias across the one or more uLED structures to instead enable the other such mode. In a receiver mode, the one or more uLED structures are operable to generate an electrical signal based on a received optical signal, whereas, in a transmitter mode, the one or more uLED structures are operable to instead generate an optical signal based on a received electrical signal.

In an embodiment, a transparent layer 620 of device 600 extends over transparent layer 620—e.g., wherein the transparent layer 620 corresponds functionally to transparent layer 550. Furthermore, device 600 comprises a wavelength conversion layer 630 which (for example) comprises quantum dots to facilitate a conversion between optical signals of different respective wavelengths. By way of illustration and not limitation, wavelength conversion layer 630 facilitates a communication of an optical signal 612 with array 410 via transparent layer 620 and a first side of the wavelength conversion layer 630. Wavelength conversion layer 630 further facilitates a communication of another optical signal 632 via a second side of the wavelength conversion layer 630 (wherein the first side is opposite the second side). A wavelength of the optical signal 612 is different than a wavelength of the optical signal 632.

In the example embodiment shown, optical signals 612, 632 each propagate away from array 410, wherein wavelength conversion layer 630 generates optical signal 632 based on optical signal 612. In an alternative embodiment, optical signals 612, 632 instead propagate each toward array 410, wherein wavelength conversion layer 630 generates optical signal 612 based on optical signal 632. In one embodiment, light 612 is a blue wavelength signal—e.g., wherein light 632 is a near infrared wavelength signal.

Figure 7:
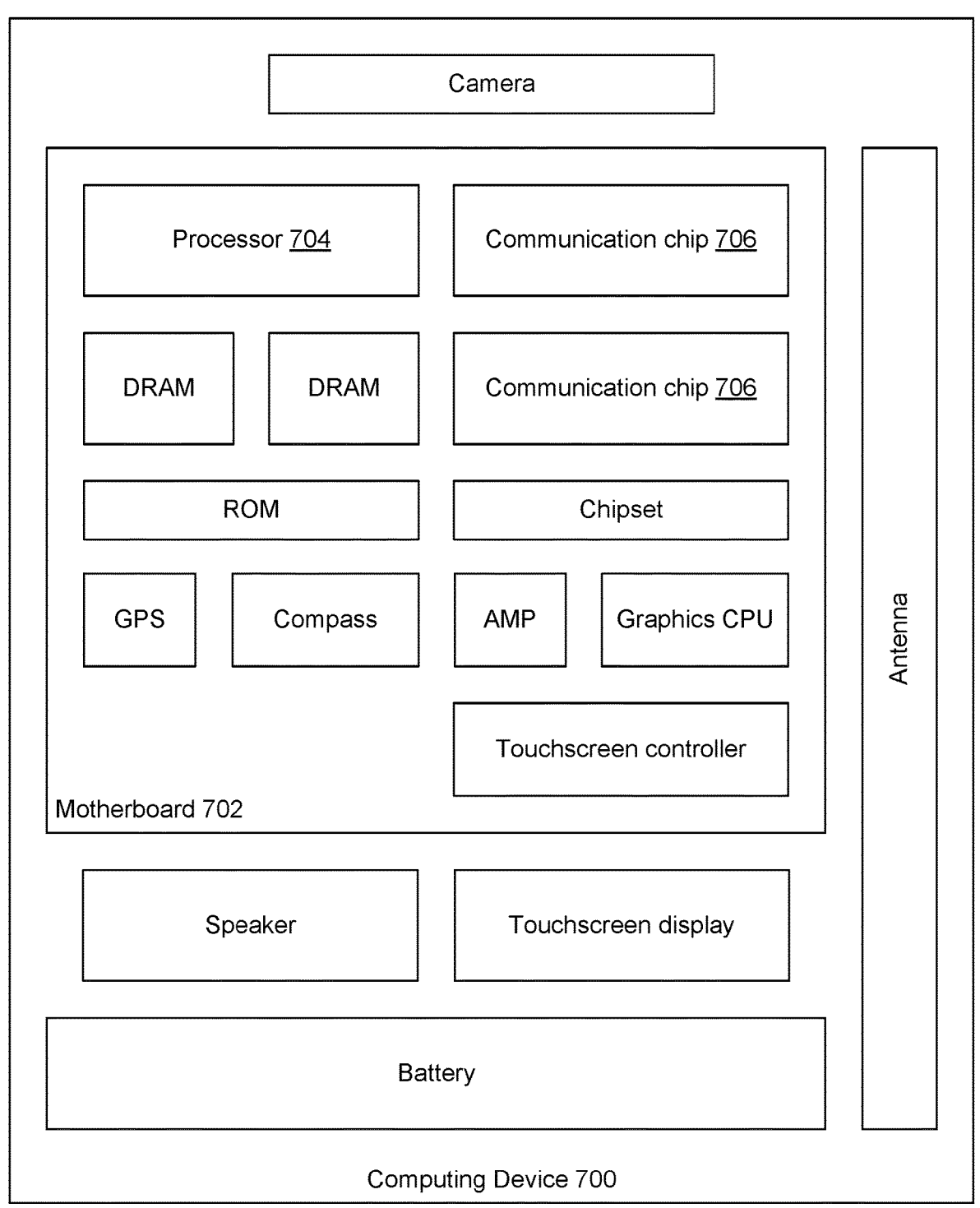
FIG. 7 is a functional block diagram illustrating a computing device in accordance with one embodiment.

FIG. 7 illustrates a computing device 700 in accordance with one embodiment. The computing device 700 houses a board 702. The board 702 may include a number of components, including but not limited to a processor 704 and at least one communication chip 706. The processor 704 is physically and electrically coupled to the board 702. In some implementations the at least one communication chip 706 is also physically and electrically coupled to the board 702. In further implementations, the communication chip 706 is part of the processor 704.

Depending on its applications, computing device 700 may include other components that may or may not be physically and electrically coupled to the board 702. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 706 enables wireless communications for the transfer of data to and from the computing device 700. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 706 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 700 may include a plurality of communication chips 706. For instance, a first communication chip 706 may be dedicated to shorter range wireless communications such as Wi-Fi and Bluetooth and a second communication chip 706 may be dedicated to longer range wireless communications such as GPS, EDGE, GPRS, CDMA, WiMAX, LTE, Ev-DO, and others.

The processor 704 of the computing device 700 includes an integrated circuit die packaged within the processor 704. The term "processor" may refer to any device or portion of a device that processes electronic data from registers and/or memory to transform that electronic data into other electronic data that may be stored in registers and/or memory. The communication chip 706 also includes an integrated circuit die packaged within the communication chip 706.

In various implementations, the computing device 700 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 700 may be any other electronic device that processes data.

Some embodiments may be provided as a computer program product, or software, that may include a machine-readable medium having stored thereon instructions, which may be used to program a computer system (or other electronic devices) to perform a process according to an embodiment. A machine-readable medium includes any mechanism for storing or transmitting information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices, etc.), a machine (e.g., computer) readable transmission medium (electrical, optical, acoustical or other form of propagated signals (e.g., infrared signals, digital signals, etc.)), etc.

Figure 8:
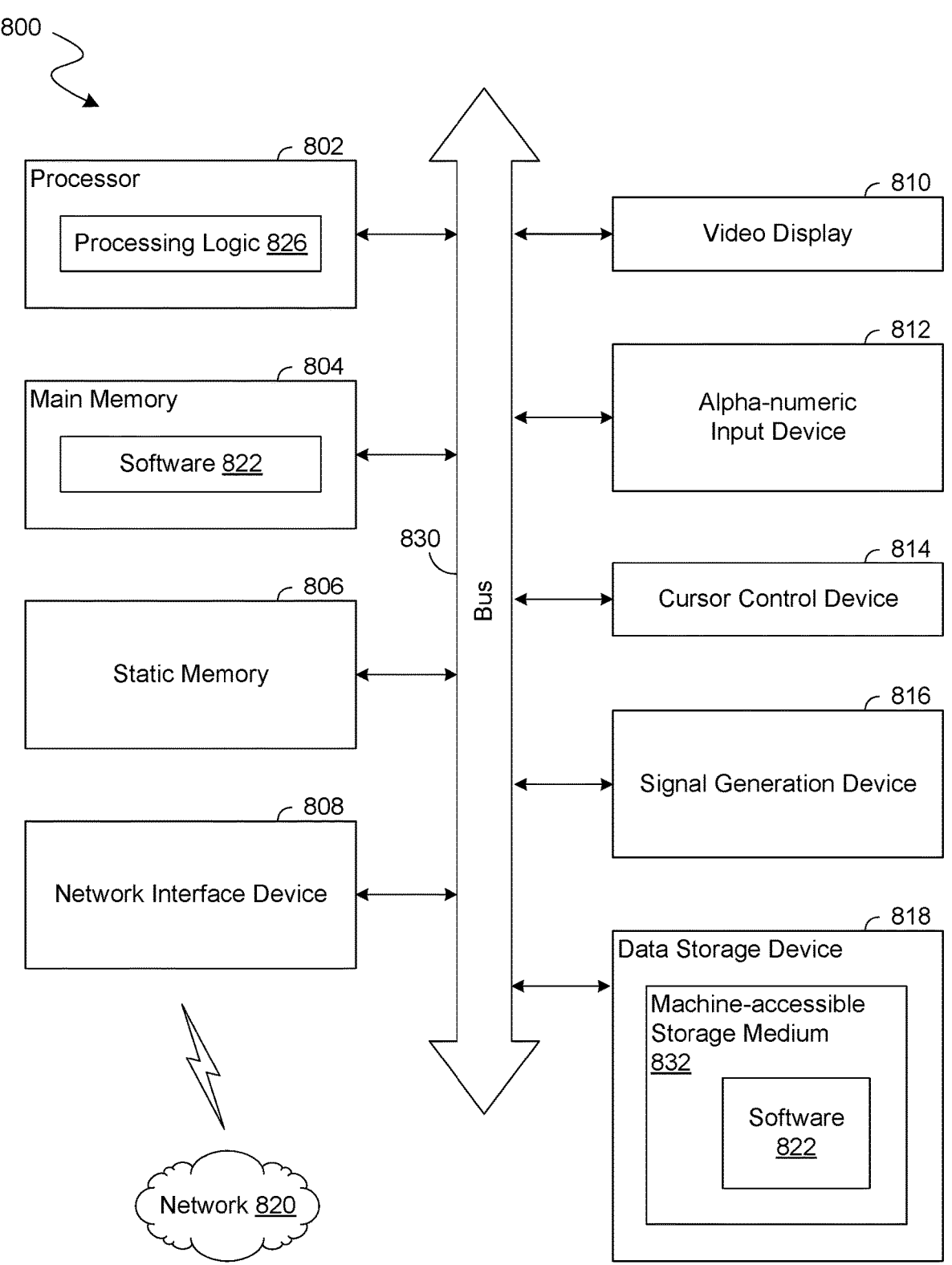
FIG. 8 is a functional block diagram illustrating an exemplary computer system, in accordance with one embodiment.

FIG. 8 illustrates a diagrammatic representation of a machine in the exemplary form of a computer system 800 within which a set of instructions, for causing the machine to perform any one or more of the methodologies described herein, may be executed. In alternative embodiments, the machine may be connected (e.g., networked) to other machines in a Local Area Network (LAN), an intranet, an extranet, or the Internet. The machine may operate in the capacity of a server or a client machine in a client-server network environment, or as a peer machine in a peer-to-peer (or distributed) network environment. The machine may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated, the term "machine" shall also be taken to include any collection of machines (e.g., computers) that individually or jointly execute a set (or multiple sets) of instructions to perform any one or more of the methodologies described herein.

The exemplary computer system 800 includes a processor 802, a main memory 804 (e.g., read-only memory (ROM), flash memory, dynamic random access memory (DRAM) such as synchronous DRAM (SDRAM) or Rambus DRAM (RDRAM), etc.), a static memory 806 (e.g., flash memory, static random access memory (SRAM), etc.), and a secondary memory 818 (e.g., a data storage device), which communicate with each other via a bus 830.

Processor 802 represents one or more general-purpose processing devices such as a microprocessor, central processing unit, or the like. More particularly, the processor 802 may be a complex instruction set computing (CISC) microprocessor, reduced instruction set computing (RISC) microprocessor, very long instruction word (VLIW) microprocessor, processor implementing other instruction sets, or processors implementing a combination of instruction sets. Processor 802 may also be one or more special-purpose processing devices such as an application specific integrated circuit (ASIC), a field programmable gate array (FPGA), a digital signal processor (DSP), network processor, or the like. Processor 802 is configured to execute the processing logic 826 for performing the operations described herein.

The computer system 800 may further include a network interface device 808. The computer system 800 also may include a video display unit 810 (e.g., a liquid crystal display (LCD), a light emitting diode display (LED), or a cathode ray tube (CRT)), an alphanumeric input device 812 (e.g., a keyboard), a cursor control device 814 (e.g., a mouse), and a signal generation device 816 (e.g., a speaker).

The secondary memory 818 may include a machine-accessible storage medium (or more specifically a computer-readable storage medium) 832 on which is stored one or more sets of instructions (e.g., software 822) embodying any one or more of the methodologies or functions described herein. The software 822 may also reside, completely or at least partially, within the main memory 804 and/or within the processor 802 during execution thereof by the computer system 800, the main memory 804 and the processor 802 also constituting machine-readable storage media. The software 822 may further be transmitted or received over a network 820 via the network interface device 808.

While the machine-accessible storage medium 832 is shown in an exemplary embodiment to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine to perform any of one or more embodiments. The term "machine-readable storage medium" shall accordingly be taken to include, but not be limited to, solid-state memories, and optical and magnetic media.

The description herein provides numerous details to provide a more thorough explanation of the embodiments of the present disclosure. It will be apparent to one skilled in the art, however, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate a greater number of constituent signal paths, and/or have arrows at one or more ends, to indicate a direction of information flow. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct connection, such as electrical, mechanical, or magnetic connection between the things that are connected, without any intermediary devices. The term "coupled" means a direct or indirect connection, such as a direct electrical, mechanical, or magnetic connection between the things that are connected or an indirect connection, through one or more passive or active intermediary devices. The term "circuit" or "module" may refer to one or more passive and/or active components that are arranged to cooperate with one another to provide a desired function. The term "signal" may refer to at least one current signal, voltage signal, magnetic signal, or data/clock signal. The meaning of "a," "an," and "the" include plural references. The meaning of "in" includes "in" and "on."

The term "device" may generally refer to an apparatus according to the context of the usage of that term. For example, a device may refer to a stack of layers or structures, a single structure or layer, a connection of various structures having active and/or passive elements, etc. Generally, a device is a three-dimensional structure with a plane along the x-y direction and a height along the z direction of an x-y-z Cartesian coordinate system. The plane of the device may also be the plane of an apparatus which comprises the device.

The term "scaling" generally refers to converting a design (schematic and layout) from one process technology to another process technology and subsequently being reduced in layout area. The term "scaling" generally also refers to downsizing layout and devices within the same technology node. The term "scaling" may also refer to adjusting (e.g., slowing down or speeding up—i.e. scaling down, or scaling up respectively) of a signal frequency relative to another parameter, for example, power supply level.

The terms "substantially," "close," "approximately," "near," and "about," generally refer to being within +/−10% of a target value. For example, unless otherwise specified in the explicit context of their use, the terms "substantially equal," "about equal" and "approximately equal" mean that there is no more than incidental variation between among things so described. In the art, such variation is typically no more than +/−10% of a predetermined target value.

It is to be understood that the terms so used are interchangeable under appropriate circumstances such that the embodiments of the invention described herein are, for example, capable of operation in other orientations than those illustrated or otherwise described herein.

Unless otherwise specified the use of the ordinal adjectives "first," "second," and "third," etc., to describe a common object, merely indicate that different instances of like objects are being referred to and are not intended to imply that the objects so described must be in a given sequence, either temporally, spatially, in ranking or in any other manner.

The terms "left," "right," "front," "back," "top," "bottom," "over," "under," and the like in the description and in the claims, if any, are used for descriptive purposes and not necessarily for describing permanent relative positions. For example, the terms "over," "under," "front side," "back side," "top," "bottom," "over," "under," and "on" as used herein refer to a relative position of one component, structure, or material with respect to other referenced components, structures or materials within a device, where such physical relationships are noteworthy. These terms are employed herein for descriptive purposes only and predominantly within the context of a device z-axis and therefore may be relative to an orientation of a device. Hence, a first material "over" a second material in the context of a figure provided herein may also be "under" the second material if the device is oriented upside-down relative to the context of the figure provided. In the context of materials, one material disposed over or under another may be directly in contact or may have one or more intervening materials. Moreover, one material disposed between two materials may be directly in contact with the two layers or may have one or more intervening layers. In contrast, a first material "on" a second material is in direct contact with that second material. Similar distinctions are to be made in the context of component assemblies.

The term "between" may be employed in the context of the z-axis, x-axis or y-axis of a device. A material that is between two other materials may be in contact with one or both of those materials, or it may be separated from both of the other two materials by one or more intervening materials. A material "between" two other materials may therefore be in contact with either of the other two materials, or it may be coupled to the other two materials through an intervening material. A device that is between two other devices may be directly connected to one or both of those devices, or it may be separated from both of the other two devices by one or more intervening devices.

As used throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C. It is pointed out that those elements of a figure having the same reference numbers (or names) as the elements of any other figure can operate or function in any manner similar to that described, but are not limited to such.

In addition, the various elements of combinatorial logic and sequential logic discussed in the present disclosure may pertain both to physical structures (such as AND gates, OR gates, or XOR gates), or to synthesized or otherwise optimized collections of devices implementing the logical structures that are Boolean equivalents of the logic under discussion.

Techniques and architectures for providing optical communication functionality are described herein. In the above description, for purposes of explanation, numerous specific details are set forth in order to provide a thorough understanding of certain embodiments. It will be apparent, however, to one skilled in the art that certain embodiments can be practiced without these specific details. In other instances, structures and devices are shown in block diagram form in order to avoid obscuring the description.

Reference in the specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment.

Some portions of the detailed description herein are presented in terms of algorithms and symbolic representations of operations on data bits within a computer memory. These algorithmic descriptions and representations are the means used by those skilled in the computing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the discussion herein, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Certain embodiments also relate to apparatus for performing the operations herein. This apparatus may be specially constructed for the required purposes, or it may comprise a general purpose computer selectively activated or reconfigured by a computer program stored in the computer. Such a computer program may be stored in a computer readable storage medium, such as, but is not limited to, any type of disk including floppy disks, optical disks, CD-ROMs, and magnetic-optical disks, read-only memories (ROMs), random access memories (RAMs) such as dynamic RAM (DRAM), EPROMs, EEPROMs, magnetic or optical cards, or any type of media suitable for storing electronic instructions, and coupled to a computer system bus.

The algorithms and displays presented herein are not inherently related to any particular computer or other apparatus. Various general purpose systems may be used with programs in accordance with the teachings herein, or it may prove convenient to construct more specialized apparatus to perform the required method steps. The required structure for a variety of these systems will appear from the description herein. In addition, certain embodiments are not described with reference to any particular programming language. It will be appreciated that a variety of programming languages may be used to implement the teachings of such embodiments as described herein.

In one or more first embodiments, a device comprises a substrate structure, a micro light emitter diode (uLED) structure extending vertically from the substrate structure, the uLED structure comprising a first body of a doped first semiconductor material, wherein the first body forms a pyramidal structure with semipolar planes of the first semiconductor material, a second body of an undoped second semiconductor material, and a third body of a doped third semiconductor material, wherein the second semiconductor material is a narrower band gap material, relative to the first semiconductor material, and relative to the third semiconductor material, wherein the first body, the second body, and the third body are arranged in a vertically stacked configuration wherein the second body is between the first body and the third body, and wherein a vertical sidewall structure of the first body is vertically between the substrate structure and a closest portion of the second body to the substrate structure.

In one or more second embodiments, further to the first embodiment, a first horizontal footprint of the first body completely overlaps a second horizontal footprint of the second body.

In one or more third embodiments, further to the second embodiment, the first horizontal footprint completely overlaps a third horizontal footprint of the third body.

In one or more fourth embodiments, further to the first embodiment or the second embodiment, the pyramidal structure is a truncated pyramid structure.

In one or more fifth embodiments, further to the first embodiment or the second embodiment, a horizontal cross-section of the first body conforms to a hexagon.

In one or more sixth embodiments, further to the first embodiment or the second embodiment, the uLED structure is a first uLED structure, the device comprises an array of multiple uLED structures which extend vertically from the substrate structure, the multiple uLED structures comprising the first uLED structure, and an arrangement of the multiple uLED structures conforms to an arrangement of hexagonal tiles in a regular tessellation pattern.

In one or more seventh embodiments, further to the first embodiment or the second embodiment, the device further comprises integrated circuitry coupled to the uLED structure, wherein the integrated circuitry is to selectively operate the uLED structure, at different times, in either one of a first mode to transmit an optical signal with the uLED structure, or a second mode to receive an optical signal with the uLED structure.

In one or more eighth embodiments, further to the first embodiment or the second embodiment, the uLED structure is a first uLED structure, the device comprises an array of multiple uLED structures which extend vertically from the substrate structure, the multiple uLED structures comprising the first uLED structure, and the device further comprises a layer of a transparent conductive material which extends over the uLED structure.

In one or more ninth embodiments, further to the eighth embodiment, the device further comprises a material layer comprising quantum dots, the material layer extends over the layer of the transparent conductive material, and the material layer is to communicate a first optical signal with the uLED structure via a first side of the material layer, and communicate a second optical signal via a second side of the layer of the material layer, the first side is opposite the second side, one of the first optical signal or the second optical signal is based on the other of the first optical signal or the second optical signal, and a first wavelength of the first optical signal is different than a second wavelength of the second optical.

In one or more tenth embodiments, a method comprises forming a first body of a doped first semiconductor material on a substrate structure, comprising forming a pyramidal structure of the first body with semipolar planes of the first semiconductor material, forming a second body of an undoped second semiconductor material on the pyramidal structure, and forming a third body of a doped third semiconductor material on the second portion, wherein a micro light emitter diode (uLED) structure comprises the first body, the second body, and the third body, wherein the second semiconductor material is a narrower band gap material, relative to the first semiconductor material, and relative to the third semiconductor material, and wherein a vertical sidewall structure of the first body is vertically between the substrate structure and a closest portion of the second body to the substrate structure.

In one or more eleventh embodiments, further to the tenth embodiment, forming the second body comprises performing a metal-organic chemical vapor deposition of the second semiconductor material.

In one or more twelfth embodiments, further to the tenth embodiment or the eleventh embodiment, a first horizontal footprint of the first body completely overlaps a second horizontal footprint of the second body.

In one or more thirteenth embodiments, further to the twelfth embodiment, the first horizontal footprint completely overlaps a third horizontal footprint of the third body.

In one or more fourteenth embodiments, further to any of the tenth through twelfth embodiments, the pyramidal structure is a truncated pyramid structure.

In one or more fifteenth embodiments, further to any of the tenth through twelfth embodiments, a horizontal cross-section of the first body conforms to a hexagon.

In one or more sixteenth embodiments, further to any of the tenth through twelfth embodiments, the uLED structure is a first uLED structure, the method further comprises forming other uLED structures of an array of multiple uLED structures which extend vertically from the substrate structure, wherein the array comprises the first uLED structure, and an arrangement of the multiple uLED structures conforms to an arrangement of hexagonal tiles in a regular tessellation pattern.

In one or more seventeenth embodiments, further to any of the tenth through twelfth embodiments, the method further comprises coupling the uLED structure to integrated circuitry which is to selectively operate the uLED structure, at different times, in either one of a first mode to transmit an optical signal with the uLED structure, or a second mode to receive an optical signal with the uLED structure.

In one or more eighteenth embodiments, further to any of the tenth through twelfth embodiments, the uLED structure is a first uLED structure, the method further comprises forming other uLED structures of an array of multiple uLED structures which extend vertically from the substrate structure, wherein the array comprises the first uLED structure, and the method further comprises forming a layer of a transparent conductive material which extends over the array.

In one or more nineteenth embodiments, further to the eighteenth embodiment, the method further comprises forming, on the layer of the transparent conductive material, a material layer comprising quantum dots.

In one or more twentieth embodiments, a system comprises a substrate structure, an array of multiple micro light emitter diode (uLED) structures extending vertically from the substrate structure, the multiple uLED structures comprising a first uLED structure which comprises a first body of a doped first semiconductor material, wherein the first body forms a pyramidal structure with semipolar planes of the first semiconductor material, a second body of an undoped second semiconductor material, and a third body of a doped third semiconductor material, wherein the second semiconductor material is a narrower band gap material, relative to the first semiconductor material, and relative to the third semiconductor material, wherein the first body, the second body, and the third body are arranged in a vertically stacked configuration wherein the second body is between the first body and the third body, and wherein a vertical sidewall structure of the first body is vertically between the substrate structure and a closest portion of the second body to the substrate structure, and integrated circuitry coupled to communicate an optical signal with the array.

In one or more twenty-first embodiments, further to the twentieth embodiment, a first horizontal footprint of the first body completely overlaps a second horizontal footprint of the second body.

In one or more twenty-second embodiments, further to the twenty-first embodiment, the first horizontal footprint completely overlaps a third horizontal footprint of the third body.

In one or more twenty-third embodiments, further to the twentieth embodiment or the twenty-first embodiment, the pyramidal structure is a truncated pyramid structure.

In one or more twenty-fourth embodiments, further to the twentieth embodiment or the twenty-first embodiment, a horizontal cross-section of the first body conforms to a hexagon.

In one or more twenty-fifth embodiments, further to the twentieth embodiment or the twenty-first embodiment, an arrangement of the multiple uLED structures conforms to an arrangement of hexagonal tiles in a regular tessellation pattern.

In one or more twenty-sixth embodiments, further to the twentieth embodiment or the twenty-first embodiment, the integrated circuitry is to selectively operate the uLED structure, at different times, in either one of a first mode to transmit an optical signal with the uLED structure, or a second mode to receive an optical signal with the uLED structure.

In one or more twenty-seventh embodiments, further to the twentieth embodiment or the twenty-first embodiment, the system further comprises a layer of a transparent conductive material which extends over the uLED structure.

In one or more twenty-eighth embodiments, further to the twenty-seventh embodiment, the system further comprises a material layer comprising quantum dots, wherein the material layer extends over the layer of the transparent conductive material, and the material layer is to communicate a first optical signal with the array via a first side of the material layer, and communicate a second optical signal via a second side of the layer of the material layer, the first side is opposite the second side, one of the first optical signal or the second optical signal is based on the other of the first optical signal or the second optical signal, and a first wavelength of the first optical signal is different than a second wavelength of the second optical.

Besides what is described herein, various modifications may be made to the disclosed embodiments and implementations thereof without departing from their scope. Therefore, the illustrations and examples herein should be construed in an illustrative, and not a restrictive sense. The scope of the invention should be measured solely by reference to the claims that follow.

What is claimed is:

1. A device comprising:
a substrate structure;
a micro light emitter diode (uLED) structure extending vertically from the substrate structure, the uLED structure comprising:
   a first body of a doped first semiconductor material, wherein the first body forms a pyramidal structure with semipolar planes of the doped first semiconductor material;
   a second body of an undoped second semiconductor material; and
   a third body of a doped third semiconductor material, wherein the undoped second semiconductor material is a narrower band gap material, relative to the doped first semiconductor material, and relative to the doped third semiconductor material; and
a dielectric structure which adjoins each of the first body, the second body, and the third body;
wherein:
the first body, the second body, and the third body are arranged in a vertically stacked configuration wherein the second body is between the first body and the third body;
a first vertical sidewall structure of the first body extends vertically to each of the substrate structure and the pyramidal structure;
a second vertical sidewall structure of the dielectric structure extends to a location where the first vertical sidewall structure adjoins a closest portion of the second body to the substrate structure; and
the second vertical sidewall structure extends vertically past both a first maximum vertical extent of the first body and a second maximum vertical extent of the second body.

2. The device of claim 1, wherein a first horizontal footprint of the first body completely overlaps a second horizontal footprint of the second body.

3. The device of claim 1, wherein the pyramidal structure is a truncated pyramid structure.

4. The device of claim 1, wherein a thickness of the second body, in a direction which is orthogonal to a facet of the pyramidal structure, varies along the facet.

5. The device of claim 1, wherein:
the uLED structure is a first uLED structure;
the device comprises an array of multiple uLED structures which extend vertically from the substrate structure, the multiple uLED structures comprising the first uLED structure; and
an arrangement of the multiple uLED structures conforms to an arrangement of hexagonal tiles in a regular tessellation pattern.

6. The device of claim 1, further comprising integrated circuitry coupled to the uLED structure, wherein the integrated circuitry is to selectively operate the uLED structure, at different times, in either one of:
a first mode to transmit an optical signal with the uLED structure; or
a second mode to receive an optical signal with the uLED structure.

7. The device of claim 1, wherein:

the uLED structure is a first uLED structure;

the device comprises an array of multiple uLED structures which extend vertically from the substrate structure, the multiple uLED structures comprising the first uLED structure; and the device further comprises a layer of a transparent conductive material which extends over the uLED structure.

8. The device of claim 7, wherein:

the device further comprises a material layer comprising quantum dots;

the material layer extends over the layer of the transparent conductive material; and the material layer is to:

communicate a first optical signal with the uLED structure via a first side of the material layer; and communicate a second optical signal via a second side of the layer of the material layer;

the first side is opposite the second side;

one of the first optical signal or the second optical signal is based on the other of the first optical signal or the second optical signal; and a first wavelength of the first optical signal is different than a second wavelength of the second optical signal.

9. A system comprising:

integrated circuitry;

a substrate structure;

an array of multiple micro light emitter diode (uLED) structures extending vertically from the substrate structure, the multiple uLED structures comprising a first uLED structure coupled to the integrated circuitry, the first uLED structure comprising:

a first body of a doped first semiconductor material, wherein the first body forms a pyramidal structure with semipolar planes of the doped first semiconductor material;

a second body of an undoped second semiconductor material; and a third body of a doped third semiconductor material, wherein the undoped second semiconductor material is a narrower band gap material, relative to the doped first semiconductor material, and relative to the doped third semiconductor material; and a dielectric structure which adjoins each of the first body, the second body, and the third body;

wherein:

the first body, the second body, and the third body are arranged in a vertically stacked configuration wherein the second body is between the first body and the third body;

a first vertical sidewall structure of the first body extends vertically to each of the substrate structure and the pyramidal structure;

a second vertical sidewall structure of the dielectric structure extends to a location where the first vertical sidewall structure adjoins a closest portion of the second body to the substrate structure;

the second vertical sidewall structure extends vertically past both a first maximum vertical extent of the first body and a second maximum vertical extent of the second body; and the integrated circuitry is to communicate a signal with the array.

10. The system of claim 9, wherein a first thickness of the second body, in a direction which is orthogonal to a facet of the pyramidal structure, varies along the facet.

11. The system of claim 9, wherein an arrangement of the multiple uLED structures conforms to an arrangement of hexagonal tiles in a regular tessellation pattern.

12. The system of claim 9, wherein the integrated circuitry is to selectively operate the first uLED structure, at different times, in either one of:

a first mode to transmit an optical signal with the first uLED structure; or a second mode to receive an optical signal with the first uLED structure.

13. The system of claim 9, further comprising a layer of a transparent conductive material which extends over the first uLED structure.

14. The system of claim 13, further comprising a material layer comprising quantum dots, wherein:

the material layer extends over the layer of the transparent conductive material; and the material layer is to:

communicate a first optical signal with the array via a first side of the material layer; and communicate a second optical signal via a second side of the layer of the material layer;

the first side is opposite the second side;

one of the first optical signal or the second optical signal is based on the other of the first optical signal or the second optical signal; and a first wavelength of the first optical signal is different than a second wavelength of the second optical signal.

* * * * *